United States Patent
Nishiyama

(10) Patent No.: US 8,508,277 B2
(45) Date of Patent: Aug. 13, 2013

(54) PHASE INTERPOLATOR, RECEPTION CIRCUIT AND INFORMATION PROCESSING APPARATUS

(71) Applicant: Fujitsu Limited, Kawasaki (JP)

(72) Inventor: Ryuichi Nishiyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/671,622

(22) Filed: Nov. 8, 2012

(65) Prior Publication Data

US 2013/0063196 A1 Mar. 14, 2013

Related U.S. Application Data

(63) Continuation of application No. PCT/JP2010/058841, filed on May 25, 2010.

(51) Int. Cl.
*H03H 11/16* (2006.01)

(52) U.S. Cl.
USPC .......................................... 327/237; 327/231

(58) Field of Classification Search
None
See application file for complete search history.

(56) References Cited

U.S. PATENT DOCUMENTS

| 6,348,826 | B1 * | 2/2002 | Mooney et al. | 327/270 |
|---|---|---|---|---|
| 2003/0042957 | A1 * | 3/2003 | Tamura | 327/233 |
| 2006/0040635 | A1 | 2/2006 | Ishida et al. | |
| 2010/0318830 | A1 * | 12/2010 | Tsuchizawa | 713/375 |
| 2011/0221506 | A1 | 9/2011 | Tamura et al. | |
| 2012/0306538 | A1 * | 12/2012 | Aryanfar et al. | 327/5 |

FOREIGN PATENT DOCUMENTS

| JP | 2001-217682 | 8/2001 |
|---|---|---|
| JP | 2004-193760 | 7/2004 |
| JP | 2005-26760 | 1/2005 |
| JP | 2006-60472 | 3/2006 |
| JP | 2006-140639 | 6/2006 |

OTHER PUBLICATIONS

International Search Report of Corresponding PCT Application PCT/JP2010/058841 mailed Aug. 17, 2010.
Patent Abstracts of Japan, Publication No. 2001-217682, Published Aug. 10, 2001.
Patent Abstracts of Japan, Publication No. 2006-060472, Published Mar. 2, 2006.
Patent Abstracts of Japan, Publication No. 2004-193760, Published Jul. 8, 2004.
Patent Abstracts of Japan, Publication No. 2005-026760, Published Jan. 27, 2005.
Patent Abstracts of Japan, Publication No. 2006-140639, Published Jun. 1, 2006.

* cited by examiner

*Primary Examiner* — Cassandra Cox
(74) *Attorney, Agent, or Firm* — Staas & Halsey LLP

(57) ABSTRACT

A third periodic signal is synthesized using a first output signal having a phase corresponding to a first periodic signal and a second output signal having a phase corresponding to the second periodic signal. A value of the third periodic signal is detected at a timing of the phase of the delayed first periodic signal. The value of the third periodic signal detected with the delayed first periodic signal is compared with the value of the third periodic signal detected by the first periodic signal delayed by the different delay amount. The delay amount is obtained for the detected third periodic signal being a maximum or a minimum. In a state of the optimum delay amount, an amplitude of the third periodic signal is adjusted so that the detected value of the third periodic signal falls within a predetermined range.

12 Claims, 14 Drawing Sheets

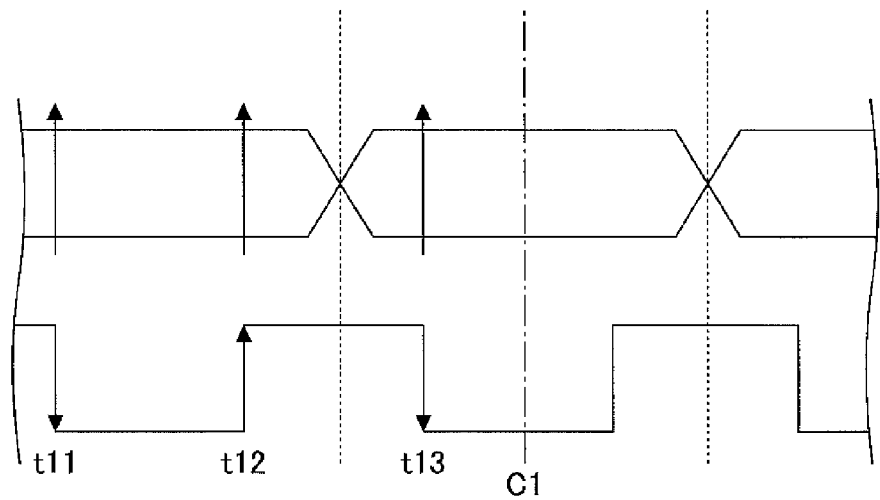
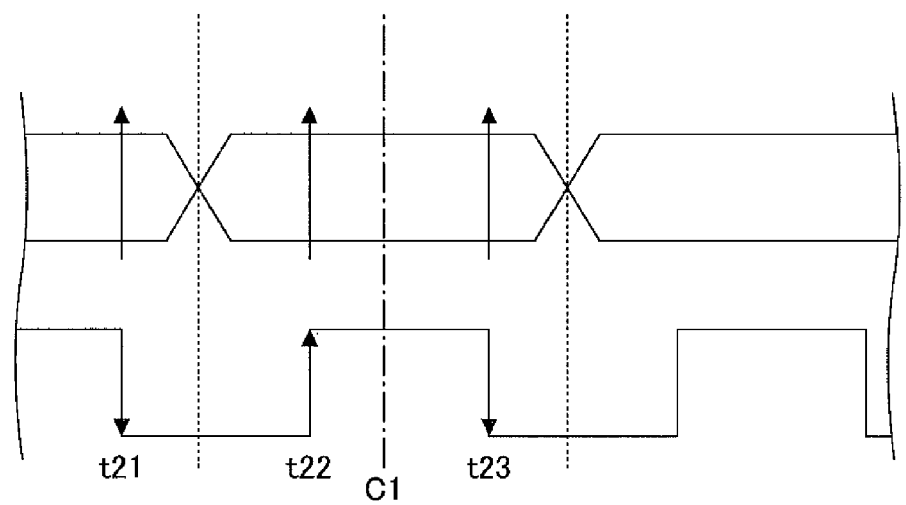

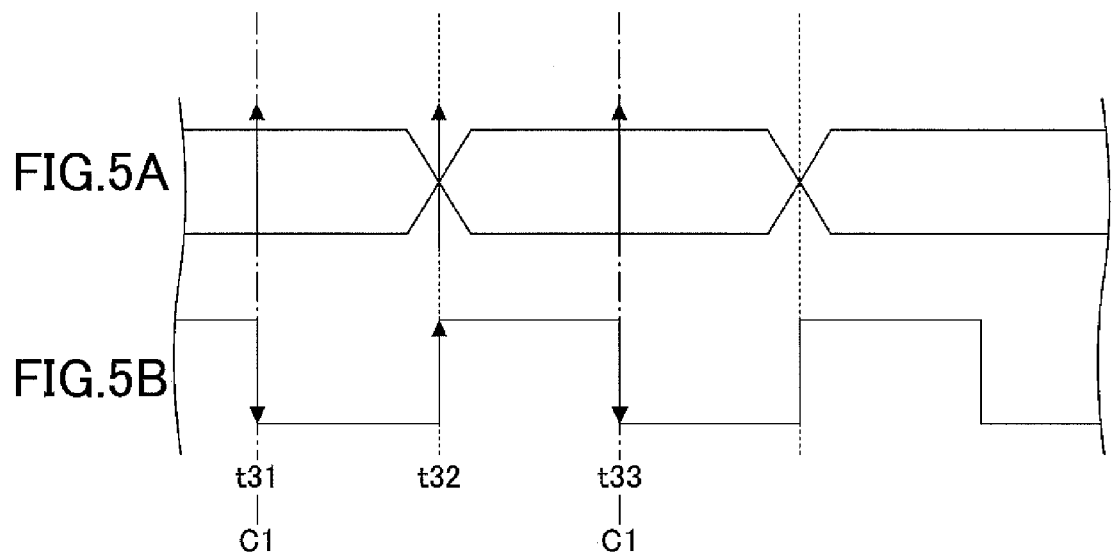

ary and explanatory and are not restrictive of the invention.

PHASE INTERPOLATOR, RECEPTION CIRCUIT AND INFORMATION PROCESSING APPARATUS

CROSS-REFERENCE TO RELATED APPLICATIONS

This application is a continuation application of International Application PCT/JP2010/058841 filed on May 25, 2010 and designated the U.S., the entire contents of which are incorporated herein by reference.

FIELD

The embodiments discussed herein are related to a phase interpolator, a reception circuit and an information processing apparatus.

BACKGROUND

As a reception front end circuit that is provided in a communication apparatus, one having a folded load down converter circuit that includes a mixer circuit, a current mirror circuit and a load circuit is known. In the folded load down converter circuit, the current mirror circuit turns back the output of the mixer circuit and the load circuit is connected to the output that is turned back by the current mirror circuit. As a reception front end circuit, one is known further having a detection circuit that carries out detection from the input signal or the output signal of the folded load down converter circuit; a smoothing circuit that smoothes the output signal of the detection circuit; and a reference comparison circuit that compares the output signal of the smoothing circuit with a predetermined reference voltage. The reception front end circuit further has a bias control circuit that controls a bias of the folded load down converter circuit depending on the comparison result of the reference comparison circuit.

PATENT REFERENCE

Patent reference No. 1: Japanese Laid-Open Patent Application No. 2006-60472
Patent reference No. 2: Japanese Laid-Open Patent Application No. 2001-217682
Patent reference No. 3: Japanese Laid-Open Patent Application No. 2006-140639

SUMMARY

According to an aspect of the embodiments, a phase interpolator includes a first signal generation circuit that generates a first output signal that has a phase corresponding to a phase of a first periodic signal that has been input; a second signal generation circuit to which a second periodic signal having a phase different from that of the first periodic signal is input, the second signal generation circuit generating a second output signal that has a phase corresponding to a phase of the second periodic signal; a third signal generation circuit that generates a third periodic signal by synthesizing the first output signal and the second output signal; a delay circuit that provides a variable delay amount to the first periodic signal; a detection circuit that detects a value of the third periodic signal at a timing corresponding to the phase of the first periodic signal that is delayed by the delay circuit; an optimum delay amount obtaining circuit that compares the value of the third periodic signal detected by the detection circuit according to the first periodic signal that has the delay amount with the value of the third periodic signal detected by the detection circuit according to the first periodic signal that has the different delay amount and obtains as an optimum delay amount, the delay amount at which the detected value of the third periodic signal is a maximum or a minimum; and an amplitude adjustment circuit that, in a state of the optimum delay amount being set to the delay circuit, adjusts an amplitude of the third periodic signal in such a manner that the value of the third periodic signal detected by the detection circuit falls within a predetermined range.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 3A and 3B, FIGS. 4A and 4B and FIGS. 5A and 5B illustrate a method of phase determination to be carried out by a phase adjuster included in the reception circuit depicted in FIG. 2;

DESCRIPTION OF EMBODIMENTS

Below, the embodiments will be described using figures.

A first embodiment is related to a Phase Interpolater (PI), a reception circuit that includes the PI and a computer that includes the reception circuits.

The PI of the first embodiment is a Complementary Metal Oxide Semiconductor (CMOS) PI that is capable of detecting the amplitude of a periodic signal that has a high frequency and thus carrying out appropriate phase synthesis without regard to the frequency of to-be-synthesized periodic signals. The to-be-synthesized periodic signals mean periodic signals which an output periodic signal that the PI obtains from the synthesis is based on. The to-be-synthesized periodic signals are one example of a first periodic signal and a second periodic signal. The output periodic signal is one example of a third periodic signal. The term "amplitude" means ½ of the range of the variations of an oscillating amount.

Figure 1:
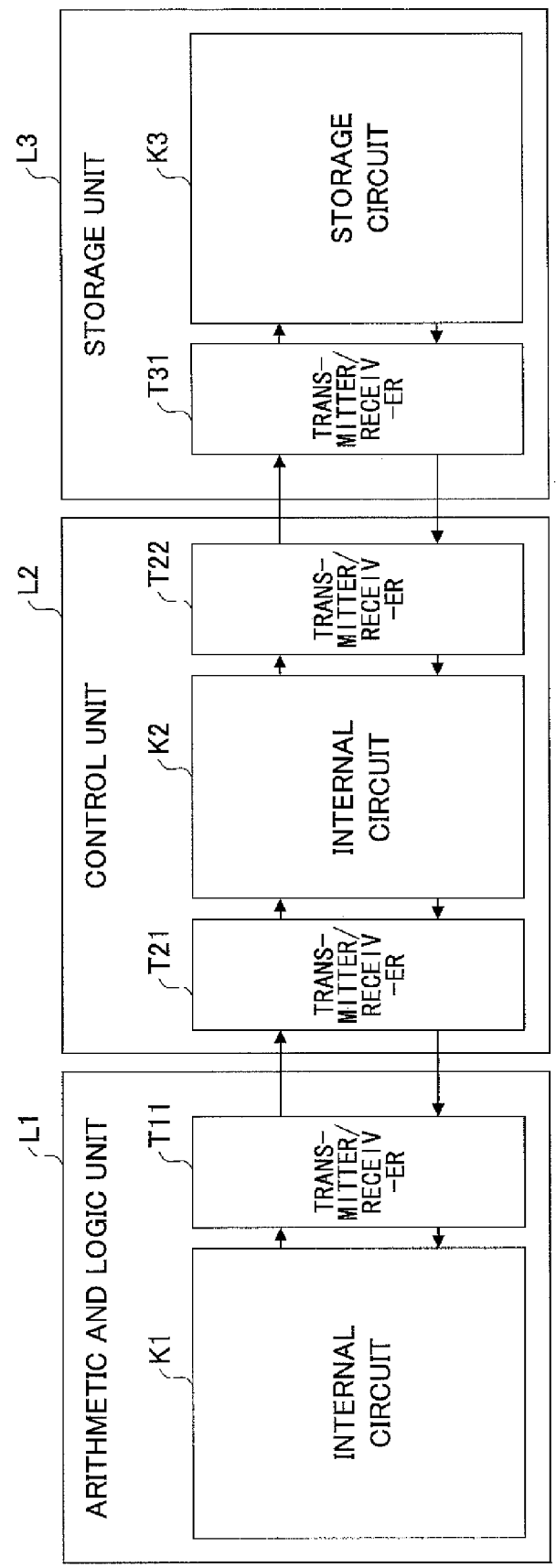
FIG. 1 is a block diagram depicting a configuration example of a computer (information processing apparatus) according to a first embodiment.

FIG. 1 is a block diagram depicting a configuration example of a computer of the first embodiment. The computer 100 of FIG. 1 includes an arithmetic and logic unit L1, a control unit L2 and a storage unit L3. The arithmetic and logic unit L1 is a Large Scale Integrated circuit (LSI) that carries out respective operations such as arithmetic operations, logic operations, comparison operations and so forth. The storage unit L3 is a LSI that stores data to be used by the arithmetic and logic unit L1 for the operations and stores data obtained from the operations. The control unit L2 is a LSI that controls operations of the arithmetic and logic unit L1 and the storage unit L3.

The above-mentioned units L1, L2 and L3 include internal circuits K1 and K2 and a storage circuit K3, respectively, which realize the respective functions. The units L1, L2 and L3 further include transmitters/receivers T11, T21, T22 and T31, respectively. The internal circuit K2 of the control unit L2 carries out transmission and reception of data with the internal circuit K1 of the arithmetic and logic unit L1 via the transmitter/receiver T21 and the transmitter/receiver T11 of the arithmetic and logic unit L1. The internal circuit K2 of the control unit L2 carries out transmission and reception of data with the storage circuit K3 of the storage unit L3 via the transmitter/receiver T22 and the transmitter/receiver T31 of the storage unit L3. In other words, the transmitters/receivers T21 and T11 carry out transmission/reception of data between the control unit L2 and the arithmetic and logic unit L1. Similarly, the transmitters/receivers T22 and T31 carry out transmission/reception of data between the control unit L2 and the storage unit L3.

The computer 100 is, for example, a server, a personal computer or the like. It is preferable to increase the data transmission rates of buses connected between the respective LSIs, L1, L2 and L3 in response to an increase of an information amount to be processed, a request to increase the speed of the processing and/or the like. For this purpose, the transmitters/receivers T11, T21, T22 and T31 that carry out transmission/reception of data between the LSIs are provided with functions as high-speed serial links. The functions as high-speed serial links may include functions of generating clock signals to be used for taking in reception data from reception signals. In this case, PIs included in the respective transmitters/receivers have the functions of generating clock signals.

Further, the PI synthesizes clock signals having the same frequency and phases that are different therebetween, i.e., to-be-synthesized periodic signals, and generates a clock signal having an optimum phase to be used for taking in reception data from a reception signal, i.e., an output periodic signal. The clock signals having the same frequency and phases that are different therebetween (i.e., to-be-synthesized periodic signals) are generated based on a reference clock signal provided externally.

As will be described later using FIG. 9, in a PI of the first embodiment, the amplitude (output amplitude) of a synthesized clock signal depends on the frequency of to-be-synthesized periodic signals. If the output amplitude exceeded a power supply voltage, the waveform information would be partially lost. As a result, there may be a case where it is not possible to generate a clock signal having an optimum phase for taking in reception data from a reception signal. In order to avoid such a situation, in the PI of the first embodiment, the output amplitude that is variable depending on the frequency of the to-be-synthesized periodic signals is detected, and the output amplitude is adjusted in such a manner that the output amplitude falls within a predetermined range.

Figure 2:
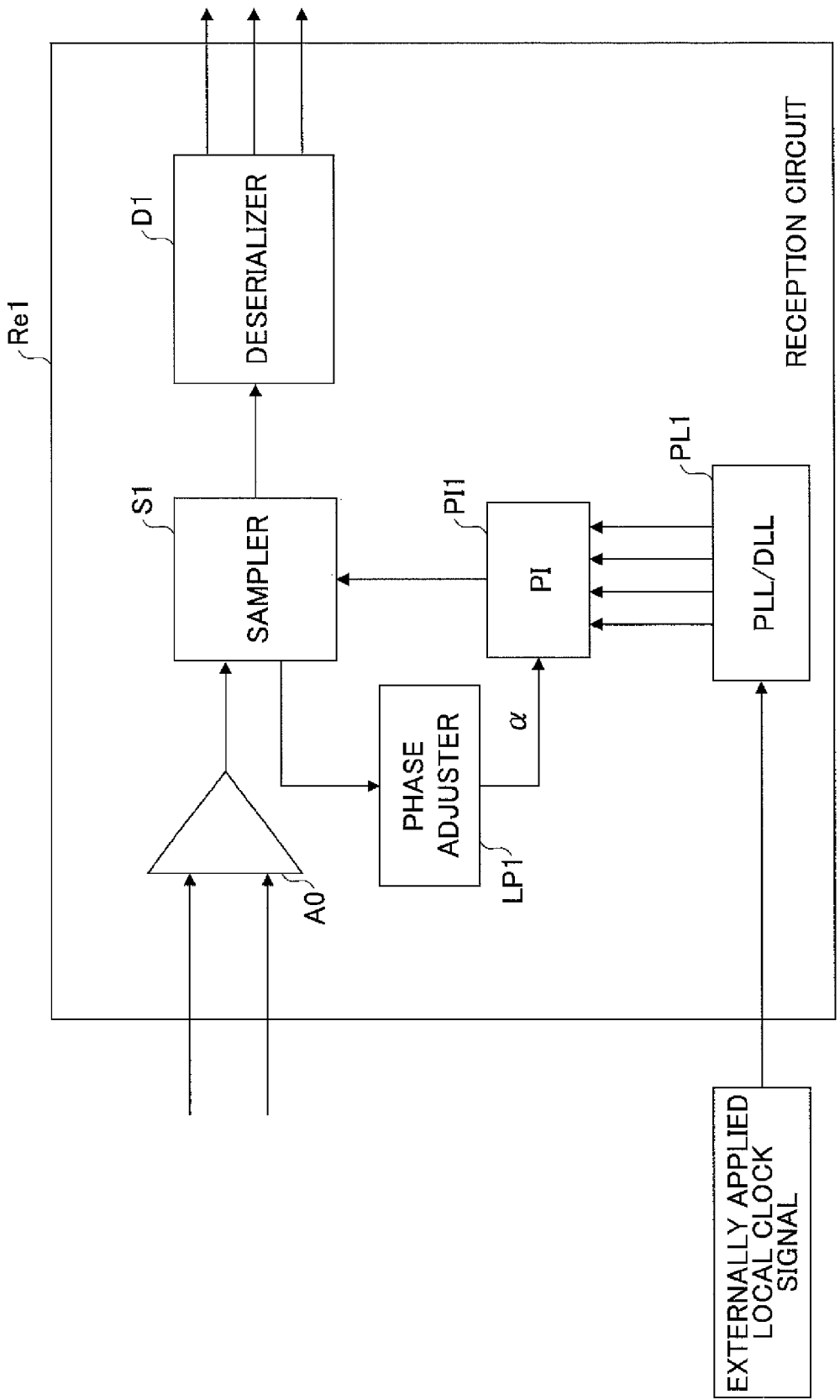
FIG. 2 is a block diagram depicting a configuration example of reception circuits included in respective transmitters/receivers included in the computer depicted in FIG. 1.

FIG. 2 depicts a configuration example of a reception circuit according to the first embodiment including a PI. The reception circuit Re1 depicted in FIG. 2 is included in each one of the transmitters/receivers T11, T21, T22 and T31 depicted in FIG. 1. As depicted in FIG. 2, the reception circuit Re1 includes an amplifier A0, a sampler S1, a deserializer D1, a PI (PI 1), a phase adjuster LP1 and a to-be-synthesized periodic signal generator PL1. As depicted in FIG. 2, the to-be-synthesized periodic signal generator PL1 may include a Phase Locked Loop (PLL) or a Delay Locked Loop (DLL). The sampler S1 is one example of a data taking circuit. The amplifier A0 amplifies a reception signal that is differential signals. The to-be-synthesized periodic signal generator PL1 is one example of a periodic signal generation circuit. The sampler S1 (for example, a flip flop circuit) takes in reception data that is high-speed serial data from a reception signal that has been amplified by the amplifier A0, in synchronization with a clock signal provided by the PI (PI1), i.e., an output periodic signal. The deserializer D1 converts the reception data taken in by the sampler S1 into parallel data and provides the parallel data to the internal circuit K1 or K2 or the storage circuit K3 (see FIG. 1).

The PI (PI1) generates the clock signal based on to-be-synthesized periodic signals provided by the to-be-synthesized periodic signal generator PL1, and provides the generated clock signal to the sampler S1. The to-be-synthesized periodic signal generator PL1 generates the to-be-synthesized periodic signals based on a reference clock signal applied externally (a local clock signal provided externally), and provides the to-be-synthesized periodic signals to the PI (PI1). It is noted that, assuming that, for example, the reception circuit Re1 is a reception circuit included in the transmitter/receiver T22, the above-mentioned locally provided local clock signal may be any one of the following three sorts of clock signals, i.e., (1), (2) and (3).

(1) a clock signal supplied by the internal circuit K2 included in the control unit L2 that includes the transmitter/receiver T22

(2) a clock signal supplied by the transmitter/receiver T31 of the storage unit L3

(3) a clock signal supplied by an apparatus/unit (not depicted) included in the computer 100 other than the arithmetic and logic unit L1, the control unit L2 and the storage unit L3.

The phase adjuster LP1 extracts, using a low pass filter, a low frequency component of the reception data taken in by the sampler S1. Based on the low frequency component, the phase adjuster LP1 generates a synthesis ratio coefficient α to be used for adjusting the phase of the clock signal that is output from the PI (PI1). Relationship between the synthesis ratio coefficient α and the phase of the clock signal that is output from the PI (PI1) will be described later using FIG. 7. It is noted that the upward pointing arrows depicted in FIG. 3A, FIG. 4A and FIG. 5A denote timings of taking in reception data from a reception signal using a clock signal.

Next, using FIGS. 3A and 3B, FIGS. 4A and 4B and FIGS. 5A and 5B, a phase adjustment method of the phase adjuster LP1 will be described. FIGS. 3A, 4A and 5A depict respective waveform examples of the reception signal that is output from the amplifier A0. FIGS. 3B, 4B and 5B depict waveform examples of the clock signal that is provided by the PI (PI1) to the sampler S1. It is noted that the examples of FIGS. 3A and 3B, FIGS. 4A and 4B and FIGS. 5A and 5B are those of a case where the clock signal is a full rate clock signal. The fact that the clock signal is a full rate clock signal means that, as depicted in FIGS. 3A and 3B, FIGS. 4A and 4B and FIGS. 5A and 5B, the periods of the reception signals are coincident with the periods of the clock signals, respectively.

FIGS. 3A and 3B depict an example of the phase of the clock signal being in advance of the phase of the reception signal. In fact, the falling edge (t13) of the clock signal in FIG. 3B is shifted leftward from the center C1 of the reception signal of FIG. 3A.

FIGS. 4A and 4B depict an example of the phase of the clock signal lagging behind the phase of the reception signal. In fact, the falling edge (t23) of the clock signal in FIG. 4B is shifted rightward from the center C1 of the reception signal of FIG. 4A.

FIGS. 5A and 5B depict an example of the phase of the clock signal being optimum. In fact, the falling edge (t33) of the clock signal in FIG. 5B is coincident with the center C1 of the reception signal of FIG. 5A.

The phase adjuster LP1 compares the data taken in by the sampler S1 at a rising edge of the clock signal with the data taken in by the sampler S1 at a falling edge of the clock signal. Thus, the phase adjuster LP1 determines whether the phase of the clock signal is appropriate with respect to the reception signal. That is, in the case of FIGS. 5A and 5B where the phase of the clock signal is optimum, the falling edges (t31, t33) of the clock signal of FIG. 5B are coincident with the centers C1 of the reception signal, respectively. Thus, it is possible to take in the reception data appropriately. On the other hand, the rising edge (t32) of the clock signal of FIG. 5B is coincident with a cross point of the reception signal of FIG. 5A. Thus, it is not possible to take in the reception data. Thus, the data taken in at the falling edges (t31, t33) of the clock signal is not coincident with the data taken in at the rising edges (t32) of the clock signal. In such a case, the phase adjuster LP1 determines that the phase is optimum, and maintains the synthesis ratio coefficient α that has been currently given to the PI (PI1).

In contrast thereto, in the case of FIGS. 3A and 3B where the phase of the clock signal is in advance of the phase of the reception signal, both the falling edge (t11) and the subsequent rising edge (t12) of the clock signal of FIG. 3B take in the same data of the reception signal of FIG. 3A (between the adjacent cross points of the reception signal). Thus, the same data is taken in at the rising edge and the falling edge of the clock signal, and thus, the thus taken in sets of data are coincident with one another. On the other hand, the further subsequent falling edge (t13) takes in reception data that is subsequent across the cross point of the reception signal. Thus, the reception data taken in at the falling edge t13 is not coincident with the reception data previously taken in at the falling edge t11 or the rising edge t12. In such a case, the phase adjuster LP1 determines that the phase of the clock signal is in advance of the reception signal, and changes the synthesis ratio coefficient α given to the PI (PI1) so as to delay the phase of the clock signal. More specifically, as will be described later using FIG. 7, the synthesis ratio coefficient α is reduced so as to increase the amplitude of a to-be-synthesized periodic signal $S_B$ that is the one having the lagging phase of to-be-synthesized periodic signals $S_A$ and $S_B$.

Further, in the case of FIGS. 4A and 4B where the phase of the clock signal is lagging behind the phase of the reception signal, the falling edge (t21) and the subsequent rising edge (t22) of the clock signal of FIG. 4B take in the different sets of reception data across the cross point of the reception signal, respectively. Thus, the sets of reception data thus taken in at these edges (t21, t22) are not coincident with one another. On the other hand, both the rising edge (t22) and the subsequent falling edge (t23) of the clock signal of FIG. 4B are included in the same period of reception signal of FIG. 4A (between the adjacent cross points). Thus, the edges t22 and t23 take in the same reception data, and thus, the respective sets of reception data thus taken in are coincident with one another. In such a case, the phase adjuster LP1 determines that the phase of the clock signal is lagging behind the reception signal, and changes the synthesis ratio coefficient α given to the PI (PI1) so as to advance the phase of the clock signal. More specifically, as will be described later using FIG. 7, the synthesis ratio coefficient α is increased so as to increase the amplitude of the to-be-synthesized periodic signal $S_A$ that is the one having the advanced phase of the to-be-synthesized periodic signals $S_A$ and $S_B$.

Next, using FIG. 6, a circuit configuration example of the PI (PI1) will be described.

The PI (PI1) includes four p-channel Complementary Metal Oxide Semiconductor Field Effect Transistors (CMOS FETs, simply referred to as "transistors" hereinafter) Tr11, Tr13, Tr21 and Tr23. The PI (PI1) further includes four n-channel CMOS FETs (also simply referred to as "transistors" hereinafter) Tr12, Tr14, Tr22 and Tr24. The PI (PI1) further includes four current sources I11, I12, I21 and I22; two capacitors Cap1 and Cap2, and an output amplifier A1. The PI (PI1) further includes a delay circuit DL1, a chopper circuit Cp1, an inverter circuit Iv1, a pass transistor circuit Past, a switch circuit SW2, a capacitor Ci, a resistance element R1, an amplifier A4 and a state machine ST1. These delay circuit DL1, chopper circuit Cp1, inverter circuit Iv1, pass transistor circuit Past, switch circuit SW2, capacitor Ci, resistance element R1, amplifier A4 and state machine ST1 will be described later using FIG. 11.

The state machine ST1 is one example of an optimum delay amount obtaining circuit, an amplitude adjustment circuit and a control circuit. Further, the transistors Tr11, Tr12, Tr13 and Tr14 and the current sources I11 and I12 are one example of a first signal generation circuit. The transistors Tr21, Tr22, Tr23 and Tr24 and the current sources I21 and I22 are one example of a second signal generation circuit. The capacitors Cap1 and Cap2 are one example of a third signal generation circuit.

The transistors Tr11 and Tr12 are connected in series and form a CMOS inverter circuit. Also the transistors Tr13 and Tr14 are connected in series and form a CMOS inverter circuit. These CMOS inverter circuits are one example of a first CMOS inverter circuit. The two CMOS inverter circuits are connected in parallel and the parallel circuit is connected in series with the current sources I11 and I12 between a power supply and ground.

Similarly, the transistors Tr21 and Tr22 are connected in series and form a CMOS inverter circuit. Also the transistors Tr23 and Tr24 are connected in series and form a CMOS inverter circuit. These CMOS inverter circuits are one example of a second CMOS inverter circuit. The two CMOS inverter circuits are connected in parallel and the parallel circuit is connected in series with the current sources I21 and I22 between a power supply and ground.

Figure 6:
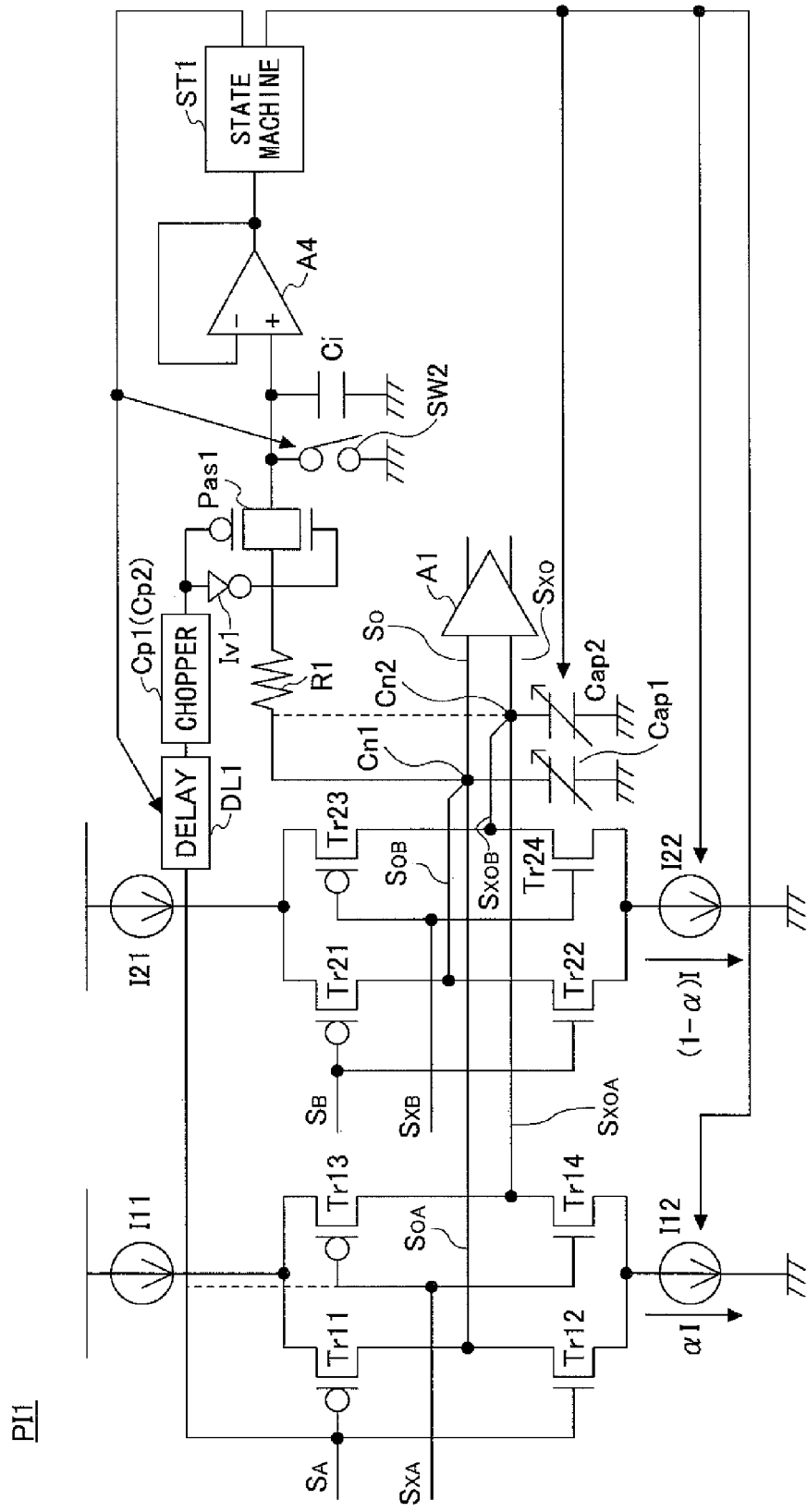
FIG. 6 is a circuit diagram depicting a configuration example of a phase interpolator included in the reception circuit depicted in FIG. 2.

The to-be-synthesized periodic signal $S_A$ and a to-be-synthesized periodic signal $S_{XA}$ are applied to the respective gates of the transistors Tr11 and Tr12 and the respective gates of the transistors Tr13 and Tr14 as depicted in FIG. 6. Similarly, the to-be-synthesized periodic signal $S_B$ and a to-be-synthesized periodic signal $S_{XB}$ are applied to the respective gates of the transistors Tr21 and Tr22 and the respective gates of the transistors Tr23 and Tr24 as depicted in FIG. 6. The to-be-synthesized period signals $S_A$, $S_{XA}$, $S_B$ and $S_{XB}$ are provided by the to-be-synthesized periodic signal generator PL1 depicted in FIG. 2. The phases of the to-be-synthesized period signals $S_A$, $S_{XA}$, $S_B$ and $S_{XB}$ have relationships of 0 degrees (0), 180 degrees ($\pi$), 90 degrees ($\pi/2$) and 270 degrees ($3\pi/2$). That is, with respect to the signal $S_A$, the signal $S_{XA}$ is lagging behind by a ½ period, the signal $S_B$ is lagging behind by a ¼ period and the signal $S_{XB}$ is lagging behind by a ¾ period. The signals $S_A$ and $S_{XA}$ are a pair of differential signals. The signals $S_B$ and $S_{XB}$ are a pair of differential signals lagging behind the signals $S_A$ and $S_{XA}$ by 90 degrees. It is noted that hereinafter, one of a pair of differential signals will be refereed to as a positive-side signal and the other will be referred to as a negative-side signal.

Further, the transistors Tr11, Tr12, the transistors Tr21, Tr22 and the variable capacitance capacitor Cap1 generate the positive-side signal $S_O$ of the differential signals based on the to-be-synthesized periodic signals $S_A$ and $S_B$. Similarly, the transistors Tr13, Tr14, the transistors Tr23, Tr24 and the variable capacitance capacitor Cap2 generate the negative-side signal $S_{XO}$ of the differential signals based on the to-be-synthesized periodic signals $S_{XA}$ and $S_{XB}$.

The current sources I11 and I12 cause a current $\alpha I$ of a value proportional to the synthesis ratio coefficient $\alpha$ to flow through the parallel circuit of the transistors Tr11, Tr12, Tr13 and Tr14. Similarly, the current sources I21 and I22 cause a current $(1-\alpha)I$ of a value proportional to $(1-\alpha)$ to flow through the parallel circuit of the transistors Tr21, Tr22, Tr23 and Tr24. As a result, the CMOS inverter circuit formed of the transistors Tr11 and Tr12 supplies a periodic current $S_{OA}$ having the amplitude $\alpha I$ according to the to-be-synthesized periodic signal $S_A$ to a connection point Cn1. On the other hand, the CMOS inverter circuit formed of the transistors Tr21 and Tr22 supplies a periodic current $S_{OB}$ having the amplitude $(1-\alpha)I$ according to the to-be-synthesized periodic signal $S_B$ that is lagging behind the signal $S_A$ by a ¼ period (90 degrees) to the same connection point Cn1.

Then, the capacitor Cap1 is charged by the periodic current $S_{OA}$ having the amplitude $\alpha I$ and the periodic current $S_{OB}$ having the amplitude $(1-\alpha)I$. As a result, as will be described later using FIG. 7, the phase of the output periodic signal $S_O$ is a phase between the phase of the to-be-synthesized periodic signal $S_A$ and the phase of the to-be-synthesized periodic signal $S_B$ lagging behind the signal $S_A$ by 90 degrees. Further, as the synthesis ratio coefficient $\alpha$ becomes greater, the output periodic signal $S_O$ comes to have the phase closer to the phase of the to-be-synthesized periodic signal $S_A$, i.e., the phase of the output periodic signal $S_O$ is advanced. As the synthesis ratio coefficient $\alpha$ becomes smaller, the output periodic signal $S_O$ comes to have the phase closer to the phase of the to-be-synthesized periodic signal $S_B$, i.e., the phase of the output periodic signal $S_O$ lags behind.

Figure 7:
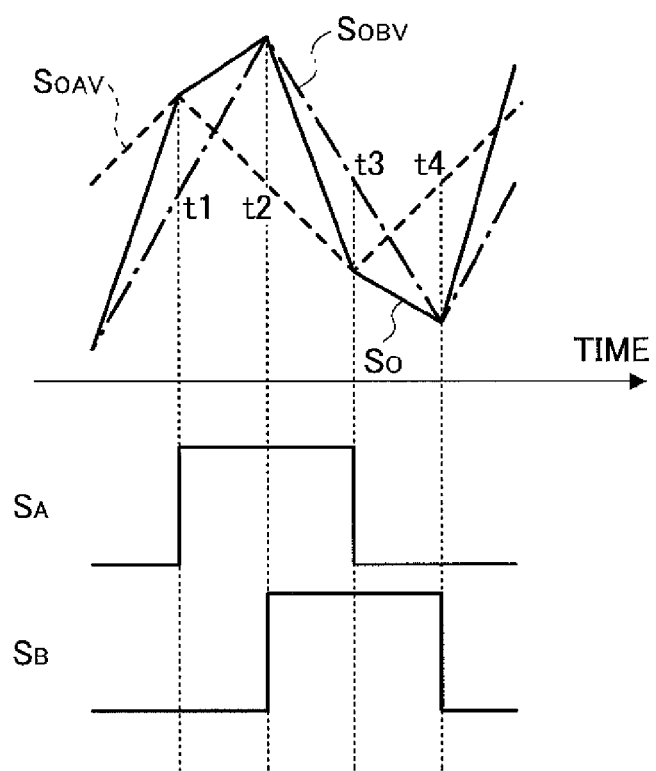
FIG. 7 illustrates a function of the phase interpolator of FIG. 6.

In FIG. 7, the waveform $S_O$ depicts the waveform of the voltage of the connection point Cn1, i.e., the voltage of the capacitor Cap1. The waveform $S_{OAV}$ depicts the waveform of the voltage of the connection point Cn1, i.e., the voltage of the capacitor Cap1 in a case where the capacitor Cap1 is charged only by the current $S_{OA}$. Similarly, the waveform $S_{OBV}$ depicts the waveform of the voltage of the connection point Cn1, i.e., the voltage of the capacitor Cap1 in a case where the capacitor Cap1 is charged only by the current $S_{OB}$.

In FIG. 7, at a time t1, when the to-be-synthesized periodic signal $S_A$ comes to have a H (High) level, the transistor Tr11 is turned off and the transistor T12 is turned on. As a result, the current of $\alpha I$ flows out from the connection point Cn1 as the current $S_{OA}$ so that the current of $\alpha I$ flows into the current source I12 via the transistor Tr12. As a result, the capacitor Cap1 is discharged, and the waveform $S_{OAV}$ has a level that is falling as depicted in FIG. 7.

At a time t2, a ¼ period (90 degrees) of the to-be-synthesized periodic signal has elapsed from the time t1. At the time t2, the to-be-synthesized periodic signal $S_B$ comes to have a H (High) level, the transistor Tr21 is turned off and the transistor T22 is turned on. As a result, the current of $(1-\alpha)I$ flows out from the connection point Cn1 as the current $S_{OB}$ so that the current of $(1-\alpha)I$ flows into the current source I22 via the transistor Tr22. As a result, the capacitor Cap1 is discharged, and the waveform $S_{OBV}$ has a level that is falling as depicted in FIG. 7.

At a time t3, a ¼ period (90 degrees) of the to-be-synthesized periodic signal has elapsed from the time t2. At the time t3, the to-be-synthesized periodic signal $S_A$ comes to have a L (Low) level, the transistor Tr11 is turned on and the transistor T12 is turned off. As a result, the current of $\alpha I$ flows through the transistor Tr11 from the current source I11, and flows into the connection point Cn1 as the current $S_{OA}$. As a result, the capacitor Cap1 is charged, and the waveform $S_{OAV}$ has a level that is rising as depicted in FIG. 7.

At a time t4, a ¼ period (90 degrees) of the to-be-synthesized periodic signal has elapsed from the time t3. At the time t4, the to-be-synthesized periodic signal $S_B$ comes to have a L (Low) level, the transistor Tr21 is turned on and the transistor T22 is turned off. As a result, the current of $(1-\alpha)I$ flows through the transistor Tr21 from the current source I21, and flows into the connection point Cn1 as the current S. As a result, the capacitor Cap1 is charged, and the waveform $S_{OBV}$ has a level that is rising as depicted in FIG. 7.

The slope of the waveform $S_{OAV}$ at a time of rising and at a time of falling is proportional to $\alpha I/\text{Cap1}$. Cap1 denotes the capacitance value of the capacitor Cap1. Similarly, the slope of the waveform $S_{OBV}$ at a time of rising and at a time of falling is proportional to $(1-\alpha)I/\text{Cap1}$. FIG. 7 depicts an example of $\alpha I<(1-\alpha)I$, i.e., $\alpha<0.5$. Thus, the slope of rising and falling of the waveform $S_{OBV}$ is greater than the slope of rising and falling of the waveform $S_{OAV}$, as depicted in FIG. 7. As a result, the amplitude of the waveform $S_{OBV}$ is greater than the amplitude of the waveform $S_{OAV}$. The waveform $S_O$ is a waveform obtained from synthesizing the waveform $S_{OAV}$ and the waveform $S_{OBV}$ (hereinafter, referred to as "$S_O=S_{OAV}+S_{OBV}$"). It is noted that, for the purpose of convenience of explanation, in FIG. 7, the waveforms are drawn based on "$S_O=(S_{OAV}+S_{OBV})/2$". The reason for "$S_O=S_{OAV}+S_{OBV}$" is that the actual voltage ($S_O$) of the capacitor Cap1 is the sum of the voltage ($S_{OAV}$) obtained from changing/discharging with the current $S_{OA}$ and the voltage ($S_{OBV}$) obtained from changing/discharging with the current $S_{OB}$. That is, the voltage signal $S_O$ (third periodic signal) can be said to be signal obtained from synthesizing the voltage signal $S_{OAV}$ (first periodic signal) and the voltage signal $S_{OBV}$ (second periodic signal). In the example of FIG. 7, as mentioned above, the amplitude of the waveform $S_{OBV}$ is greater than the amplitude of the waveform $S_{OAV}$. Thus the phase of the synthesized waveform $S_O$ is closer to the phase of the waveform $S_{OBV}$ than the phase of the waveform $S_{OAV}$.

In the same or a similar way of thinking, in a case of $\alpha I > (1-\alpha)I$, i.e., $\alpha > 0.5$, the amplitude of the waveform $S_{OAV}$ is greater than the amplitude of the waveform $S_{OBV}$. Thus the phase of the synthesized waveform $S_O$ is closer to the phase of the waveform $S_{OAV}$ than the phase of the waveform $S_{OBV}$. Further in the same or a similar way of thinking, the phase of the synthesized waveform $S_O$ becomes closer to the phase of the waveform $S_{OAV}$ than the phase of the waveform $S_{OBV}$ as the synthesis ratio coefficient $\alpha$ is increased. The waveforms $S_{OAV}$ and $S_{OBV}$ are based on the to-be-synthesized periodic signals $S_A$ and $S_B$. Thus, as a result of the to-be-synthesized periodic signal $S_B$ lagging behind the to-be-synthesized periodic signal $S_A$ by 90 degrees (see FIG. 7), the phase of the waveform $S_{OBV}$ is lagging behind the phase of the waveform $S_{OAV}$ by 90 degrees accordingly. Thus, the phase of the synthesized waveform $S_O$ is advanced as the synthesis ratio coefficient $\alpha$ becomes larger, and the phase of the synthesized waveform $S_O$ lags behind as the synthesis ratio coefficient $\alpha$ becomes smaller.

Further, from the above-mentioned relationship of "$S_O = S_{OAV} + S_{OBV}$", the relationship of "$O = \alpha O(A) + (1-\alpha)O(B)$" holds on the positive side of the differential signals. It is noted that $O = S_O$, $\alpha O(A) = S_{OAV}$ and $(1-\alpha)O(B) = S_{OBV}$. $O(A)$ has a phase corresponding to the signal $S_A$, and $O(B)$ has a phase corresponding to the signal $S_B$. From the above-mentioned relationship of "$O = \alpha O(A) + (1-\alpha)O(B)$", the output periodic signal $S_O$ has a phase closer to the phase of the to-be-synthesized periodic signal $S_A$ and has the phase that is advanced, as the synthesis ratio coefficient $\alpha$ becomes larger. On the other hand, the output periodic signal $S_O$ has a phase closer to the phase of the to-be-synthesized periodic signal $S_B$ and has the phase that lags behind, as the synthesis ratio coefficient $\alpha$ becomes smaller.

Similarly, also on the negative side of the differential signals, the relationship of "$O = \alpha O(A) + (1-\alpha)O(B)$" holds. In this case, $0 = S_{XO}$. $O(A)$ has a phase corresponding to the signal $S_{XA}$, and $O(B)$ has a phase corresponding to the signal S. As a result, the output periodic signal $S_{XO}$ has a phase closer to the phase of the to-be-synthesized periodic signal $S_{XA}$ and has the phase that is advanced, as the synthesis ratio coefficient $\alpha$ becomes larger. On the other hand, the output periodic signal $S_{XO}$ has a phase closer to the phase of the to-be-synthesized periodic signal $S_{XB}$ and has the phase that lags behind, as the synthesis ratio coefficient $\alpha$ becomes smaller.

Thus, according to the PI (PI1) of FIG. 6, the respective phases of the output periodic signal $S_O$ and the output periodic signal $S_{XO}$ are uniquely determined by the synthesis ratio coefficient $\alpha$ between the to-be-synthesized periodic signals $S_A$ and $S_B$ and between the to-be-synthesized periodic signals $S_{XA}$ and $S_{XB}$.

Figure 8:
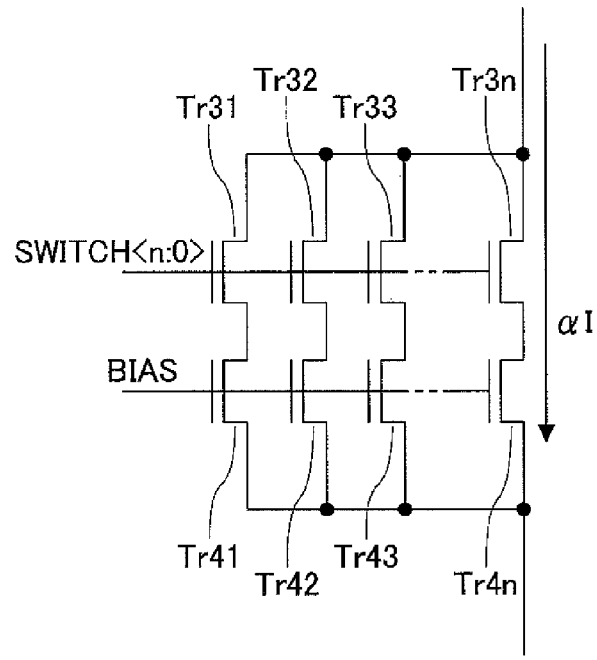
FIG. 8 is a circuit diagram depicting a configuration example of a current source(s) included in the phase interpolator of FIG. 6.

FIG. 8 depicts a circuit example of a current source in which the current value is adjustable by n-bit switches, applicable to any one of the four current sources I11, I12, I21 and I22 depicted in FIG. 6. In the circuit of FIG. 8, a series circuit of n-channel Metal Oxide Semiconductor Field Effect Transistors (MOS FET, simply referred to as "transistors" hereinafter) Tr31, Tr41, a series circuit of transistors Tr32, Tr42, . . . and a series circuit of transistors Tr3n, Tr4n, i.e., a total of the n series circuits, are connected in parallel, as depicted. In the circuit of FIG. 8, the voltages at the respective gates of the n transistors Tr31, Tr32 . . . and Tr3n on the side of power supply are individually controlled, and the number of transistors that are turned on from among the n transistors is controlled. Thus, the current value the circuit flows is controlled. It is noted that the n transistors Tr41, Tr42 and Tr4n are made to be always in states of having been turned on.

Using FIG. 9, a problem will be described which may occur because the amplitudes of the output periodic signals $S_O$ and $S_{XO}$ depend on the frequency of the to-be-synthesized periodic signals $S_A$, $S_B$, $S_{XA}$ and $S_{XB}$. In FIG. 9, the waveform Hf1 depicts a waveform example of the output periodic signal in a case where the frequency of the to-be-synthesized periodic signals is low. The waveform Lf1 depicts a waveform example of the output periodic signal in a case where the frequency of the to-be-synthesized periodic signals is high. It is noted that the common mode voltage C11 of the output periodic signals $S_O$ and $S_{XO}$ is determined by the output resistances of the current sources I11, I12, I21 and I22 and the input impedance of the output amplifier A1. On the other hand, the amplitudes of the output periodic signals $S_O$ and $S_{XO}$ are determined by, in a case where the frequency of the to-be-synthesized periodic signals is fixed, the capacitance values of the capacitors Cap1 and Cap2 and the current values of the current sources I11, I12, I21 and I22. This is because as depicted in FIG. 9, the speeds of voltage rising and falling in response to the charging and discharging of the capacitors Cap1 and Cap2 by the signals $S_A$, $S_B$, $S_{XA}$ and $S_{XB}$ are proportional to the values obtained from dividing the charging and discharging currents by the capacitance values of the capacitors Cap1 and Cap2 for which the charging and discharging are carried out.

Figure 9:
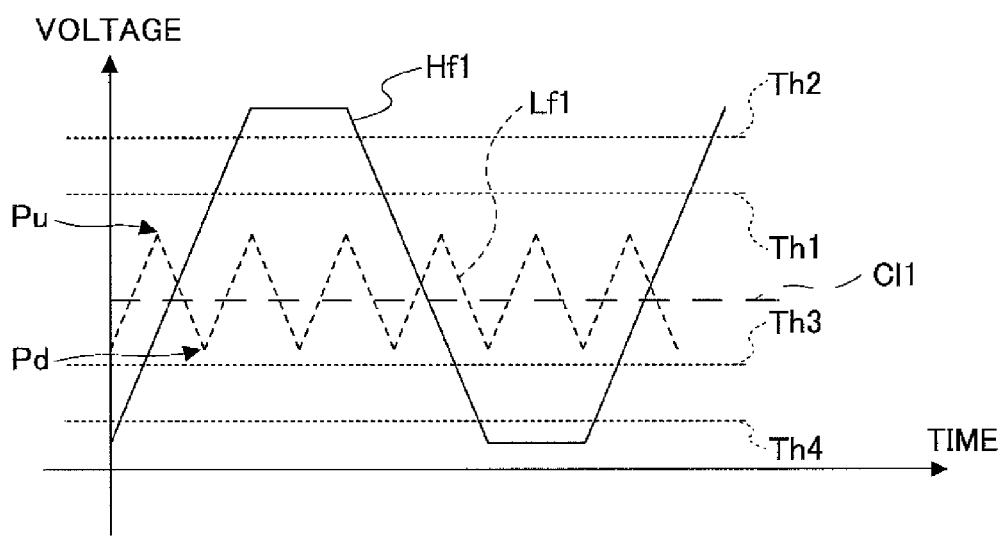
FIG. 9 illustrates frequency dependency of an output amplitude in the phase interpolator of FIG. 6.

As depicted in FIG. 9, in the case where the frequency of the to-be-synthesized periodic signals is lower, the capacitors Cap1 and Cap2 are charged and discharged for relatively long periods of time. Thus, the voltages of the output periodic signals become larger. On the other hand, in the case where the frequency of the to-be-synthesized periodic signals is higher, the capacitors Cap1 and Cap2 are charged and discharged for relatively short periods of time. Thus, the voltages of the output periodic signals become smaller. When the amplitude of the output periodic signal is too large as in the waveform Hf1, phase information may be lost as a result of the upper end parts and the lower end parts of the waveform being cut off. Thus, it may be not possible to carry out phase interpolation precisely. Further, when the amplitude of the output periodic signal is too small as in the waveform Lf1, it may be not possible to drive the output amplifier A1, and it may be not possible to output the clock signal.

In order to avoid such a situation, in the PI (PI1) according to the first embodiment, the amplitude(s) of the output periodic signal(s) is(are) controlled so as to cause them to fall within a predetermined range. More specifically, as one example, in a case of the upper parts of the waveform, control is made such that the upper-side peaks of the waveform will fall within the range between the upper limit threshold of amplitude Th2 and the lower limit threshold of amplitude Th1. In a case of the lower parts of the waveform, control is made such that the lower-side peaks of the waveform will fall within the range between the upper limit threshold of amplitude Th4 and the lower limit threshold of amplitude Th1. It is noted that in FIG. 9, in the case of the waveform Lf1, the upper-side peak is the part indicated by Pu and the lower-side peak is a part indicated by Pd. Thus, control is made such that the amplitude(s) of the output periodic signal(s) will fall within the range between an upper limit and a lower limit. It is noted that control of the amplitude(s) of the output periodic signal(s) is carried out by control of the current values I of the current sources I11, I12, I21 and I22 and the capacitance values of the capacitors Cap1 and Cap2, in the configuration of the PI (PI1) of FIG. 6.

It is noted that in a case where dynamic control of the output periodic signal(s) is not carried out, it is possible to previously set the current values I of the current sources I11, I12, I21 and I22 and the capacitance values of the capacitors Cap1 and Cap2, at a time of designing the PI. Alternatively, it is also possible to provide a configuration of being able to externally set the current values I of the current sources I11, I12, I21 and I22 and the capacitance values of the capacitors Cap1 and Cap2 for the purpose of being able to respond to characteristic variations due to process variations of the PI. Further, in this case, in consideration of responding to plural different frequencies of the to-be-synthesized periodic signals, the plural different frequencies of the to-be-synthesized periodic signals may be already known. However, it is preferable that it is possible to respond also to a case where plural different frequencies of the to-be-synthesized periodic signals are not known. In the case of the PI (PI1) according to the first embodiment, it is possible to respond also to a case where plural different frequencies of the to-be-synthesized periodic signals are not known. That is, according to the PI (PI1) of the first embodiment, an amplitude detection circuit that detects the amplitude(s) of the output periodic signal(s) is provided (described later using FIGS. 10 and 11). Then, the value(s) of the amplitude(s) of the output periodic signal(s) detected by the amplitude detection circuit is(are) fed back. Thus, the current values I of the current sources I11, I12, I21 and I22 and the capacitance values of the capacitors Cap1 and Cap2 are dynamically controlled. As a result, it is possible to appropriately synthesize the to-be-synthesized periodic signals without regard to the frequency of the to-be-synthesized periodic signals and without regard to the characteristic variations due to process variations of the PI.

Figure 10:
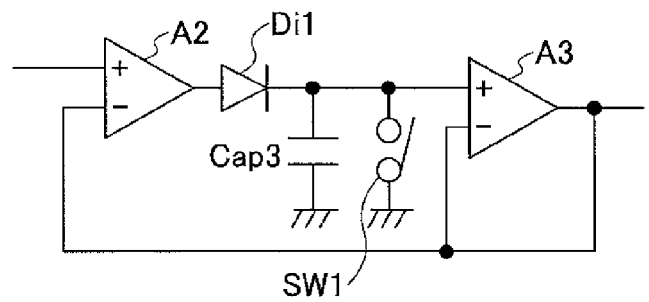
FIG. 10 is a circuit diagram depicting a configuration example of an amplitude detection circuit (peak hold circuit)

Next, the amplitude detection circuit for controlling the amplitude(s) of the output periodic signal(s) $S_O$ and/or $S_{XO}$ will be described. FIG. 10 depicts a circuit example of the amplitude detection circuit applicable to the first embodiment. The amplitude detection circuit of FIG. 10 is one example of a peak hold circuit. The amplitude detection circuit of FIG. 10 includes an amplifier A2, a diode Di1, a capacitor Cap3, a switch SW1 and an amplifier A3. According to the amplitude detection circuit of FIG. 10, the capacitor Cap3 is charged in a case where the voltage of the output periodic signal amplified by the amplifier A2 exceeds the voltage of the capacitor Cap3. As a result, the voltage of the capacitor Cap3 becomes the same as the voltage of the output periodic signal amplified by the amplifier A2. Then, the voltage of the capacitor Cap3 is amplified by the amplifier A3 and is output. The switch SW1 is provided for the purpose of resetting the amplitude detection circuit. While the amplitude detection circuit is being operated, the switch SW1 is in the turned off state. It is noted that in the case of the amplitude detection circuit of FIG. 10, the input signal is not limited to a periodic signal. The circuit example of FIG. 10 may be not suitable to a case where the frequency of the to-be-synthesized periodic signals is high, i.e., the to-be-synthesized periodic signals are high frequency signals, due to the limitations of operations of the amplifiers A2 and A3 and the diode Di1. Further, from the viewpoint of the threshold value of the diode Di1, the circuit example of FIG. 10 may be not suitable to a case of a low voltage circuit.

Figure 11:
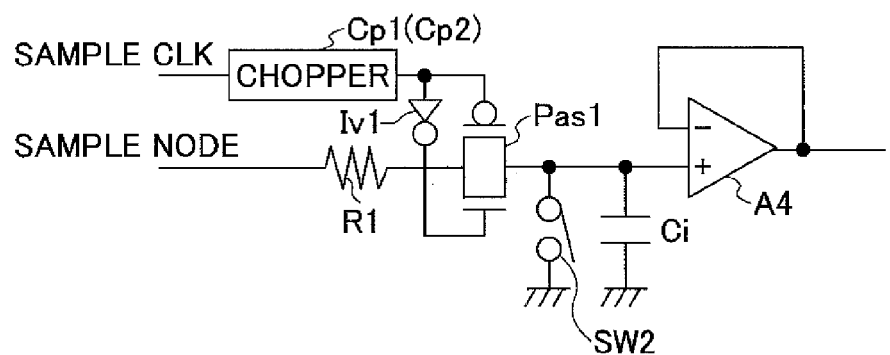
FIG. 11 is a circuit diagram depicting a preferable configuration example of the amplitude detection circuit.

FIG. 11 depicts another circuit example of the amplitude detection circuit applicable to the first embodiment, which may be used as a substitute for the circuit example of FIG. 10, and is actually applied in the configuration of FIG. 6. The circuit example of FIG. 11 is more preferable than the circuit example of FIG. 10 to a case where the frequency of the to-be-synthesized periodic signals is high, and also, is more preferable to a case of a low voltage circuit. The circuit example of FIG. 11 is a sampling type amplitude detection circuit in which the input signal is limited to a periodic signal, thus the operation speed of the amplitude detection circuit is increased and the circuit configuration concerning amplitude detection is simplified. The circuit example of FIG. 11 includes the chopper circuit Cp1, resistance element R1, inverter circuit Iv1, pass transistor circuit Past (as a gate), switch SW2, capacitor Ci and amplifier A4 (as an output driver). Operations of the amplitude detection circuit of FIG. 11 will be described later using FIGS. 14 through 17.

Figure 12A:
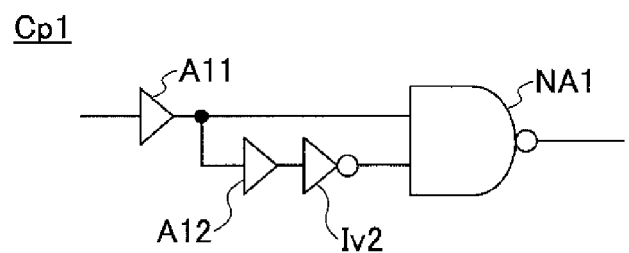
FIG. 12A is a circuit diagram depicting a configuration example of a chopper circuit included in the phase interpolator of FIG. 6.
Figure 12B:
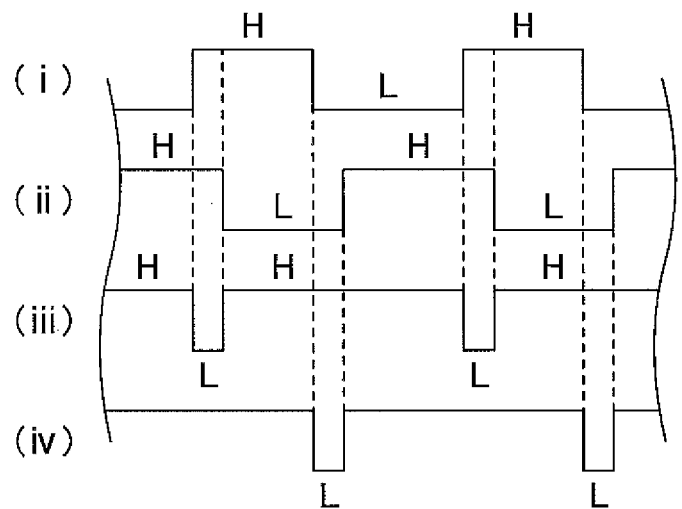
FIG. 12B illustrates operations of the chopper circuit of FIG. 12A.

FIG. 12A depicts a circuit example of the chopper circuit Cp1, and FIG. 12B illustrates operations of the chopper circuit Cp1. The circuit example of the chopper circuit Cp1 depicted in FIG. 12A includes amplifiers A11, A12, an inverter circuit Iv2 and a NAND circuit device NA1. To the chopper circuit Cp1 of FIG. 12A, the to-be-synthesized periodic signal $S_A$ is applied through the delay circuit DL1 depicted in FIG. 6. The signal applied to the chopper circuit Cp1 is amplified by the amplifier A11, and is then directly applied to one input terminal of the NAND circuit device NA1. FIG. 12B, (i) depicts the signal waveform applied to the one input terminal of the NAND circuit device NA1. The signal thus amplified by the amplifier A11 is also inverted and delayed by the amplifier A12 and the inverter Iv2, and then is input to the other input terminal of the NAND circuit device NA1. FIG. 12B, (ii) depicts the signal waveform applied to the other input terminal of the NAND circuit device NA1. FIG. 12B, (iii) depicts the signal waveform of the output signal of the NAND circuit device NA1. As depicted in FIG. 12B, the chopper circuit Cp1 generates a so-called chop signal (FIG. 12B, (iii)) based on the signal obtained from delaying the to-be-synthesized signal $S_A$ by the delay circuit DL1. The chop signal is one example of a timing signal. The NAND circuit device NA1 outputs the L level only when the inputs to both the input terminals have H levels simultaneously so as to generate the chop signal. It is noted that the chop signal means a signal that has a H (high) level or a L (low) level during short periods of time, as depicted in FIG. 12B, (iii) or (iv). The example of FIG. 12B, (iii) is an example of a chop signal having the L level during short periods of time as depicted.

Figure 12C:
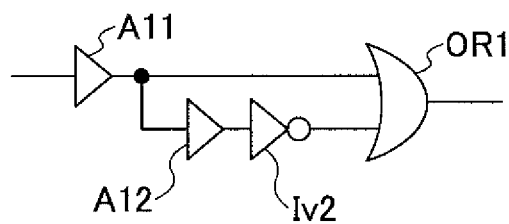
FIG. 12C is a circuit diagram depicting another configuration example of the chopper circuit included in the phase interpolator of FIG. 6.

FIG. 12C depicts a circuit example of a chopper circuit Cp2 in which an OR circuit device OR1 is used instead of the NAND circuit device NA1 depicted in the circuit example of FIG. 12A. Also the chopper circuit Cp2 of the circuit example of FIG. 12C generates a chop signal based on the signal obtained from delaying the to-be-synthesized signal $S_A$ by the delay circuit DL1, the same as the chopper circuit Cp1 of FIG. 12A. However, the chopper circuit Cp1 of FIG. 12A generates the chop signal (FIG. 12B, (iii)) having the level L at a timing of a change of the level of the input signal (FIG. 12B, (i)) from L to H. In contrast thereto, the chopper circuit Cp2 of FIG. 12C generates the chop signal (FIG. 12B, (iv)) having the level L at a timing of a change of the level of the input signal (FIG. 12B, (i)) from H to L. This is because the OR circuit device OR1 of FIG. 12C outputs the L level only when the inputs to both the input terminals have L levels simultaneously. An amplitude detection method by the circuit example of FIG. 11 using any one of these chop signals will be described later using FIGS. 14, 15, 16 and 17.

Figure 13:
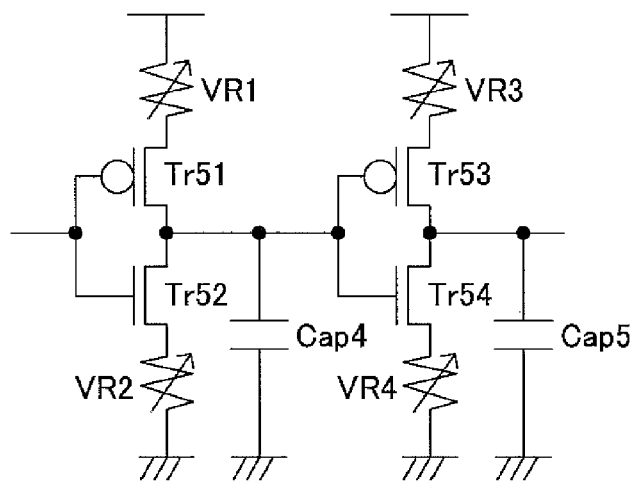
FIG. 13 is a circuit diagram depicting a configuration example of a delay circuit included in the phase interpolator of FIG. 6.

FIG. 13 depicts a circuit example of the delay circuit DL1. The circuit example of FIG. 13 includes variable resistors VR1, VR2, VR3 and VR4, a CMOS inverter circuit formed of transistors Tr51 and Tr52, a CMOS inverter circuit formed of transistors Tr53 and Tr54 and capacitors Cap4 and Cap5.

According to the circuit example of FIG. 13, when an input signal is inverted and transmitted by the respective CMOS inverter circuits, the transmission is delayed during operations of charging and discharging the capacitors Cap4 and Cap5 provided on the respective output sides of the CMOS inverter circuits. The speeds of the charging and discharging the capacitors Cap4 and Cap5 become higher as the respective resistance values of the variable resisters VR1, VR2, VR3 and VR4 become smaller. Thus, by increasing the respective resistance values of the variable resisters VR1, VR2, VR3 and VR4, it is possible to elongate the periods of time of charging and discharging the capacitors Cap4 and Cap5 and to increase the delay amount of the delay circuit DL1.

Figure 14:
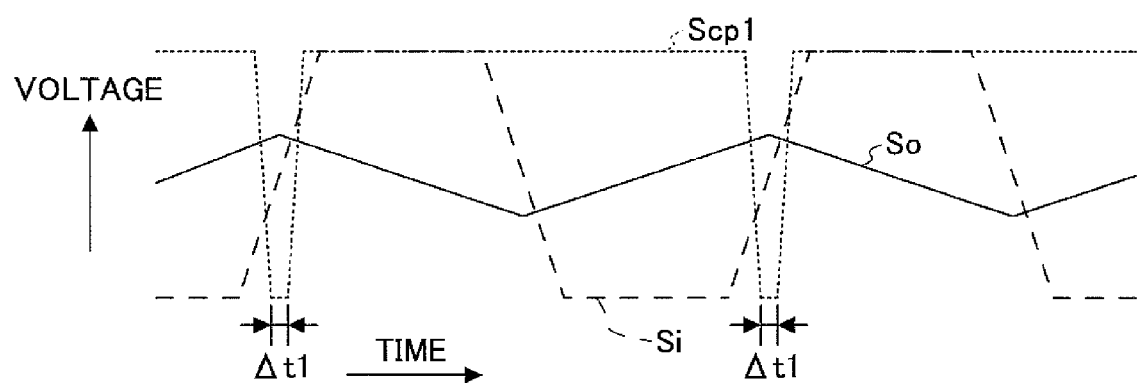
FIGS. 14 and 15 illustrate functions of the amplitude detection circuit depicted in FIG. 11.

Next, using FIGS. 14, 15, 16 and 17, operations of the amplitude detection circuit of the circuit example of FIG. 11 will be described. FIG. 14 depicts waveform examples of the signal Si obtained from delaying the to-be-synthesized periodic signal $S_A$ by the delay circuit DL1, the output signal of the chopper circuit Cp1, i.e., the chop signal Scp1, and the output periodic signal $S_O$. As described above using FIG. 12B, the chopper circuit Cp1 generates the chop signal Scp1 of a L level at a timing of a change of the level of the signal Si from L to H, and provides the generated signal to the pass transistor circuit Pas1.

The pass transistor circuit Pas1 depicted in FIG. 11 is a parallel circuit of a p-channel MOS FET and an n-channel MOS FET. As depicted in FIG. 11, the p-channel MOS FET is directly controlled by the output of the chopper circuit Cp1 (Cp2) and the n-channel MOS FET is controlled via the inverter circuit Iv1. The transistors of the pass transistor circuit Pas1 open the respective gates in the timing of the L level of the chop signal Scp1. During a period of time in which the gates are thus opened, the output periodic signal that is input via the resistance element R1 is passed through the transistors. As depicted in FIG. 14, the delay amount given by the delay circuit DL1 is adjusted as will be described later so that the timing of the chop signal Scp1 having the L level will be coincident with the timing of the output periodic signal having the upper-side peak. As a result, the pass transistor circuit Pas1 allows the output periodic signal $S_O$ to pass therethrough only during a fixed period of time Δt1 that is coincident with the upper-side peak of the output periodic signal $S_O$.

It is noted that as depicted in FIG. 7, the upper-side peak of the waveform $S_{OAV}$ corresponding to the to-be-synthesized periodic signal $S_A$ is coincident with the timing of a change in the level of the to-be-synthesized periodic signal $S_A$ from L to H. Thus, for example, in a case of α=1, the waveform $S_{OBV}$ always has the zero level. Thus, the waveform of the output periodic signal $S_O$ is coincident with the waveform $S_{OAV}$. In such a case, it is preferable to set the delay amount of the delay circuit DL1 to zero and obtain the chop signal Scp1 that has the level L at the timing of a change in the level of the to-be-synthesized periodic signal from L to H. As a result, the timing of the chop signal Scp1 having the level L is approximately coincident with the timing of the upper-side peak of the output periodic signal $S_O$. However, as mentioned above, the phase of the output periodic signal $S_O$ is changed depending on the value of the synthesis ratio coefficient α. Also, the phase of the output periodic signal $S_O$ may be changed due to process variations of the PI (PI1) or the like. In consideration thereof, as mentioned above, it is preferable to previously adjust the timing of the chop signal Scp1 having the L level to be coincident with the timing of the output periodic signal having the upper-side peak and thus realizing the state of FIG. 14 or FIG. 17 that will be described later. It is possible to adjust the timing of the chop signal Scp1 having the L level by adjusting the delay amount of the delay circuit DL1. A specific method of the adjustment will be described later using FIG. 18.

Returning to the description of FIG. 11, the capacitor Ci is charged by the signal that has passed through the pass transistor circuit Pas1, the voltage of the capacitor Ci is amplified by the amplifier A4, and then is supplied to the state machine ST1. The switch SW2 used to completely discharge the capacitor Ci is turned on/off by the state machine ST1, and is normally turned off. According to the circuit example of FIG. 11, the capacitor Ci is repetitively charged by the voltage of the upper-side peak of the output periodic signal $S_O$ that has passed through the pass transistor circuit Pas1. As a result, the voltage of the capacitor Ci gradually approaches the voltage of the upper-side peak of the output periodic signal $S_O$. Thus, as a result of continuing the repetitive charging of the capacitor Ci for a fixed period of time and then taking the output of the amplifier A4, it is possible to detect a voltage close to the voltage of the upper-side peak of the output periodic signal $S_O$. After thus detecting the voltage of the upper-side peak of the output periodic signal $S_O$, it is determined whether the detected voltage value falls within a predetermined range. In a case where the detected voltage value does not fall within the predetermined range, the amplitude of the output periodic signal $S_O$ is controlled so that the detected voltage value will fall within the predetermined range as a result of appropriate adjustment of the current sources I11, I12, I21 and I22 and the capacitance values of the capacitors Cap1 and Cap2. Details of the control will be described later using FIGS. 18 and 19.

Figure 16:
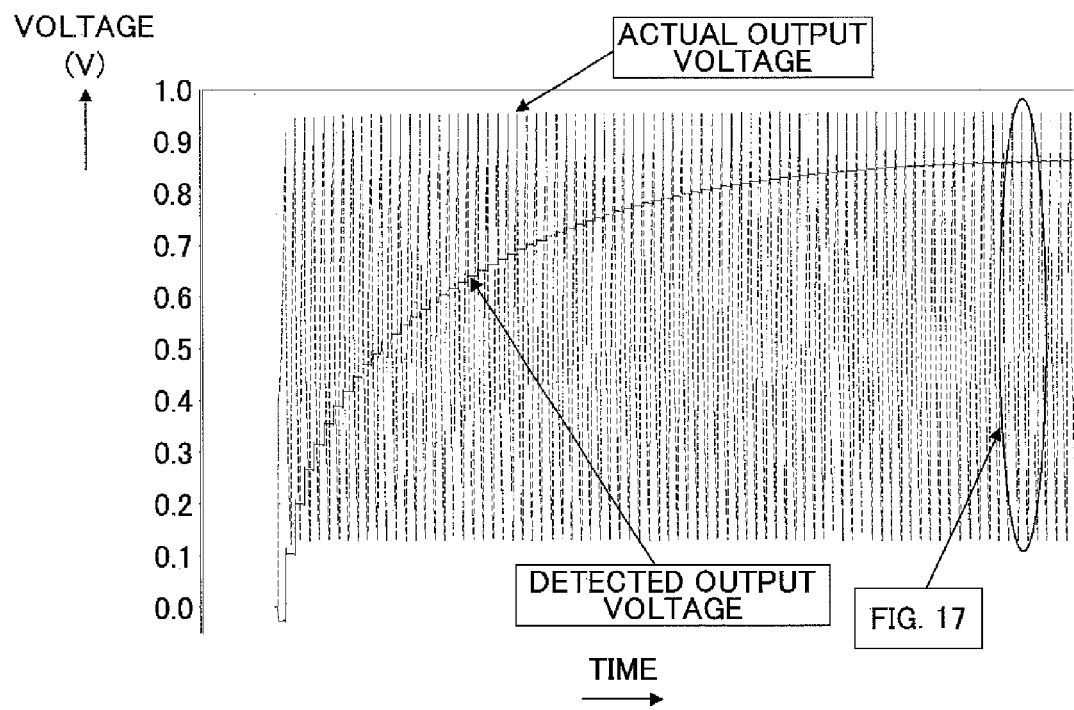
FIGS. 16 and 17 illustrate a method of amplitude detection of the phase interpolator of FIG. 6.
Figure 17:
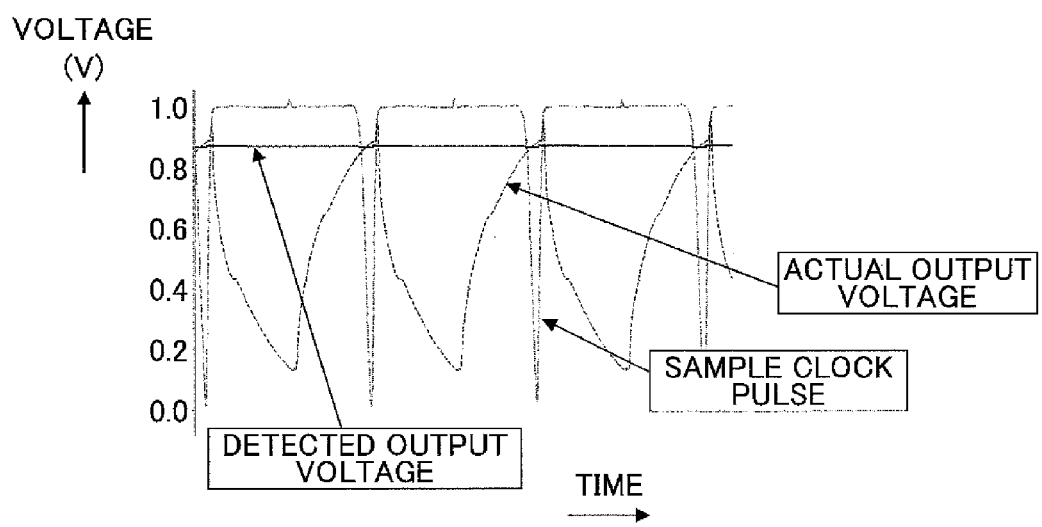

FIGS. 16 and 17 illustrate a state of a case where repetitive charging of the capacitor Ci is continued. In FIGS. 16 and 17, "ACTUAL OUTPUT VOLTAGE" indicates a waveform of the output periodic signal $S_O$, and "DETECTED OUTPUT VOLTAGE" indicates a voltage detected by the amplitude detection circuit of FIG. 11. Further, in FIG. 17, "SAMPLE CLOCK PULSE" indicates a waveform of the chop signal Scp1 of FIG. 14. FIG. 17 depicts a view obtained from magnifying the time axis of the part of FIG. 16 indicated by "FIG. 17" and depicts a state obtained after operations of the repetitive charging of the capacitor Ci have been carried out during a period of time sufficient for the saturation of the "DETECTED OUTPUT VOLTAGE". As depicted in FIGS. 16 and 17, according to the amplitude detection circuit of FIG. 11, as a result of the repetitive charging of the capacitor Ci, the "DETECTED OUTPUT VOLTAGE" gradually approaches the "ACTUAL OUTPUT VOLTAGE". Thus, by continuously carrying out the repetitive charging of the capacitor Ci for the sufficient period of time, it is possible to obtain a voltage value close to the upper-side peak voltage of the output periodic signal $S_O$ of the PI (PI1) of FIG. 6.

Figure 15:
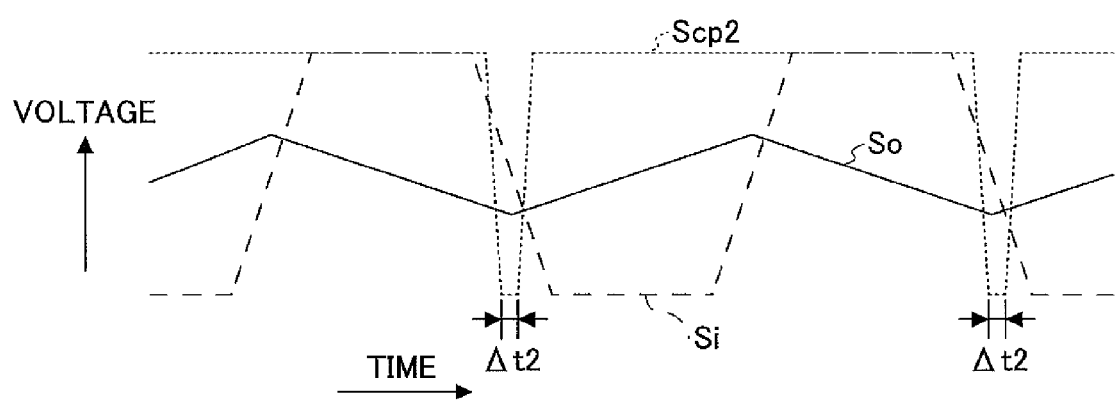

Thus, the operations of the amplitude detection circuit have been described when the voltage of the upper-side peak of the output periodic signal is to be detected. Next, using FIG. 15, operations of the amplitude detection circuit when the voltage of the lower-side peak of the output periodic signal $S_O$ is detected will be described. What is different from the case of FIG. 14 is that the chop signal Scp2 has the L level at the timing of a change in the level of the input signal Si from H to L. In the example of FIG. 15, instead of the chopper circuit Cp1 described above using FIG. 12A, the chopper circuit Cp2 described above using FIG. 12C is used.

In a case where the chopper circuit Cp2 of FIG. 12C is used in the amplitude detection circuit of FIG. 11, the delay amount given by the delay circuit DL1 is adjusted so that the timing of the chop signal Scp1 having the L level will be coincident with the timing of the output periodic signal having the lower-side peak. As a result, the pass transistor circuit Pas1 allows the output periodic signal $S_O$ to pass therethrough only during a fixed period of time Δt2 that is coincident with the lower-side peak of the output periodic signal $S_O$. As a result, the capacitor Ci is repetitively charged by the voltage of the lower-side peak of the output periodic signal $S_O$ that has passed through the pass transistor circuit Pas1. As a result, the voltage of the capacitor Ci gradually approaches the voltage of the lower-side peak of the output periodic signal $S_O$. Thus, as a result of continuing the repetitive charging of the capacitor Ci for a fixed period of time and then taking the output of the amplifier A4, it is possible to detect a voltage close to the voltage of the lower-side peak of the output periodic signal $S_O$. After thus detecting the voltage of the lower-side peak of the output periodic signal, it is determined whether the detected voltage value falls within a predetermined range. In a case where the detected voltage value does not fall within the predetermined range, the amplitude of the output periodic signal $S_O$ is controlled so that the detected voltage value will fall within the predetermined range as a result of appropriate adjustment of the current sources I11, I12, I21 and I22 and the capacitance values of the capacitors Cap1 and Cap2.

Figure 18:
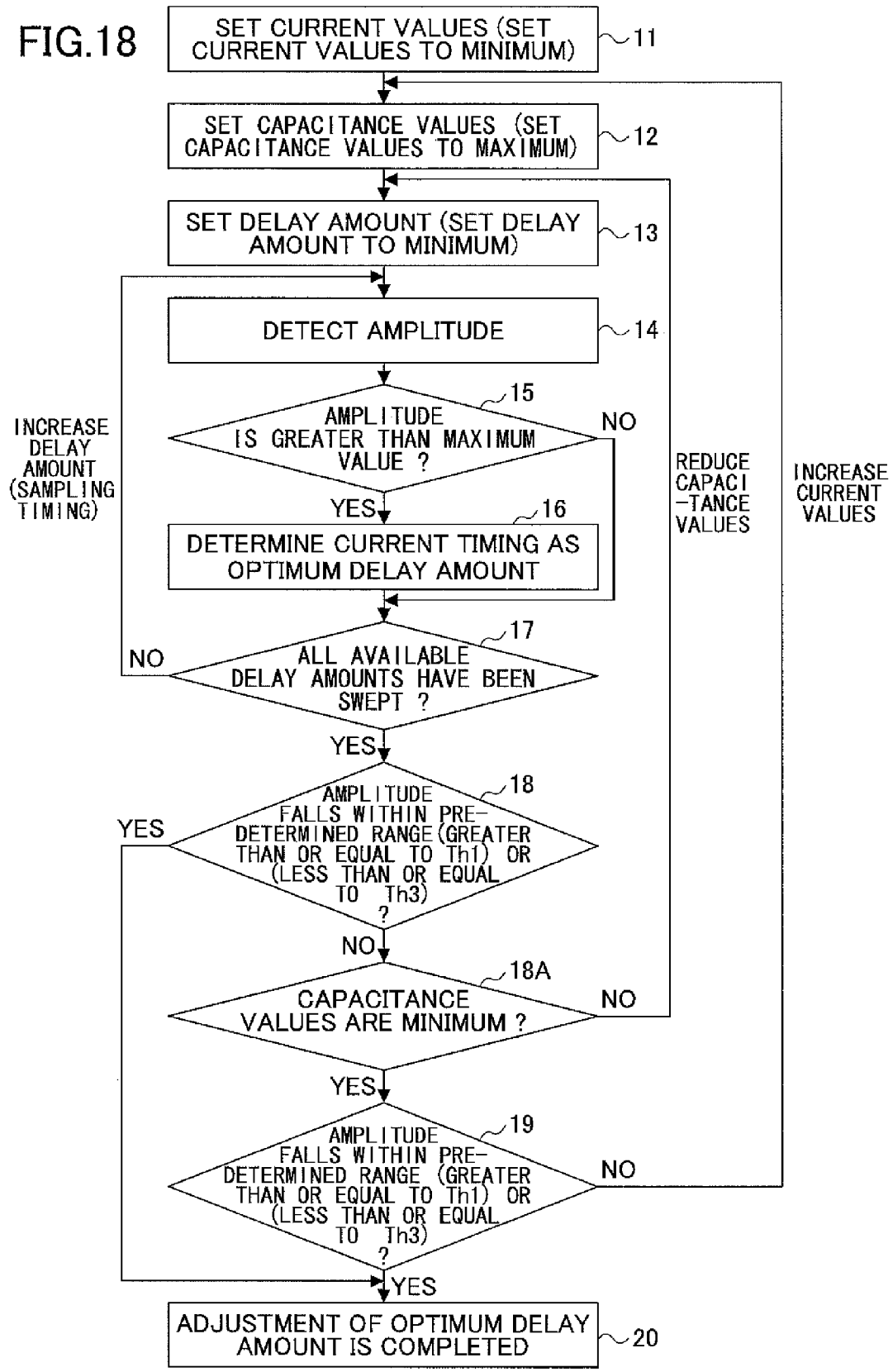
FIG. 18 is a flowchart illustrating a flow of operations of adjusting a delay amount given by the delay circuit of the phase interpolator of FIG. 6.

Next, using FIG. 18, a flow of operations of adjusting the delay amount of the delay circuit DL1 so that the timing of the chop signal Scp1 having the L level will be coincident with the timing of the upper-side peak of the output periodic signal $S_O$ will be described. Control of FIG. 18 is carried out by the state machine ST1.

In step 11, the current values I of the respective current sources I11, I12, I21 and I22 are set to the minimum values. In step 12, the respective capacitance values of the capacitors Cap1 and Cap2 are set to the maximum values. In step 13, the delay amount of the delay circuit DL1 is set to the minimum value. In step 14, the voltage value of the output periodic signal $S_O$, i.e., the amplitude is detected by the amplitude detection circuit of FIG. 11. In step 15, the voltage value detected in step 14 is compared with the voltage values that have been detected before and it is determined whether the current detected value is a maximum (i.e., whether the currently detected amplitude is greater than the maximum value of amplitudes that have been detected until then). In a case where the current detection value is a maximum, the processing proceeds to step 16. In step 16, the current delay amount of the delay circuit DL1 is determined as an optimum value, and the processing proceeds to step 17. In a case where in step 15, it has been determined that the current detection value is not a maximum, the processing skips over step 16 and directly proceeds to step 17.

In step 17, it is determined whether all the values that can be used to set as the delay amount of the delay circuit DL1 have been already used for the settings (i.e., whether all the available delay amounts have been swept). In a case where all the values that can be used for the settings have not been used for the settings yet, the delay amount of the delay circuit DL1 is increased by a predetermined amount, and the processing returns to step 14. Then, until it has been determined in step 17 that all the values that can be used for the settings have been already used for the settings, the loop operations of steps S14, 15, 16 and 17 are repeated. When it has been determined in step 17 that all the values that can be used for the settings have been already used for the settings, the processing proceeds to step 18. In step 18, the delay amount of the delay circuit DL1 determined as the optimum value in the immediately preceding step 16 is obtained as a current optimum value. By thus repeating the loop operations of steps S14 through S17, it is possible to obtain as an optimum value the delay amount at which the voltage value obtained in step 14 is a maximum from among all the values that can be set as the delay amount of the delay circuit DL1.

In step 18, it is determined whether the voltage value of the output periodic signal $S_O$ detected in the immediately preceding step 14 falls within a predetermined range, for example, the range greater than or equal to the threshold Th1 of FIG. 9. It is noted that in this case, the range of the voltage value greater than or equal to the threshold Th1 is the above-mentioned predetermined range. In a case where the voltage value of the output periodic signal $S_O$ is less than the threshold Th1, it is then determined in step 18A whether the current respective capacitance values of the capacitors Cap1 and Cap2 of the PI (PI1) are the minimum values of those that can be used to set as the capacitance values. The operations of step 18A are those of sweeping the capacitance values that can be used to set as those of the capacitors Cap1 and Cap2, respectively. In a case where the current respective capacitance values of the capacitors Cap1 and Cap2 are not minimum values of those that can be used for the settings, each of the capacitance values of the capacitors Cap1 and Cap2 of the PI (PI1) is reduced by a predetermined amount, and the processing proceeds to step 13. Then, until the current respective capacitance values of the capacitors Cap1 and Cap2 become minimum values in step 18A, the loop operations of steps 13 through 18A are repeated. However, when the voltage value of the signal $S_O$ becomes greater than or equal to the threshold Th1 in step 18 before the capacitance values become minimum values in step 18A, the processing proceeds to step 20 at the time.

In step 20, the delay amount of the delay circuit DL1 determined as an optimum value in the immediately preceding step 16 is obtained as a final delay amount of the delay circuit DL1, and the operations of FIG. 18 is finished (i.e., adjustment of optimum delay amount is completed).

Through the above-mentioned loop operations of steps 13 through 18A, the capacitance values of the capacitors Cap1 and Cap2 are gradually reduced, the speeds of voltage changes due to charging/discharging of the capacitors Cap1 and Cap2 are gradually increased, and thus the amplitude of the output periodic signal $S_O$ is gradually increased. As mentioned above, when in step 18 the voltage value of the signal $S_O$ detected in step 14 becomes greater than or equal to the threshold Th1 before the capacitance values become minimum values in step 18A, the processing proceeds to step 20.

On the other hand, during the repetitions of the loop operations of steps 13 through 18A, when the respective current capacitance values of the capacitors Cap1 and Cap2 become minimum values in step 18A before in step 18 the voltage value of the signal $S_O$ detected in step 14 becomes greater than or equal to the threshold Th1, the processing proceeds to step 19.

In step 19, it is determined whether the voltage value of the output periodic signal $S_O$ detected in the immediately preceding step 14 is greater than or equal to the threshold Th1. It is noted that as mentioned above, the range of the voltage greater than or equal to the threshold Th1 is the predetermined range. In a case where the voltage value of the signal $S_O$ is less than the threshold Th1, each of the current values I of the respective current sources I11, I12, I21 and I22 is increased by a predetermined amount, and the processing returns to step 12. Then, until the voltage value of the signal $S_O$ becomes greater than or equal to the threshold Th1 in step 19, the loop operations of steps 12 through 19 are repeated. That is, in a case where the sweeping of the capacitance values (the repetitions of loop operations of steps 13 through 18A) has been completed until the voltage value of the signal $S_O$ falls within the predetermined range (step 18 yes), the sweeping of the current values (the repetitions of loop operations of steps 12-19) is carried out. Through the repetitions of loop operations of steps 12-19, the current values of the current source I11, I12, I21 and I22 are gradually increased, the speeds of voltage changes due to charging/discharging of the capacitors Cap1 and Cap2 are gradually increased, and thus the amplitude of the output periodic signal $S_O$ is gradually increased. When the voltage value of the output periodic signal $S_O$ detected in step 14 becomes greater than or equal to threshold Th1, the processing proceeds to step 20.

Thus, the case of obtaining the upper-side peak of the voltage value of the output periodic signal $S_O$ has been described. The same or similar way may be also applied in a case of obtaining the lower-side peak of the voltage value of the output periodic signal $S_O$. However, in this case, it is determined in step 18 whether the voltage value detected in the immediately preceding step 14 falls within the range less than or equal to the threshold Th3 depicted in FIG. 9. Further, in step 18A, it is determined whether the current capacitance values are minimum values. In this case, the range of the voltage value less than or equal to the threshold Th3 is the predetermined range. Then, the loop operations of steps 13 through 18A are repeated until the current capacitance values become minimum values in step 18A. However, when the voltage value becomes less than or equal to the threshold Th3 in step 18 before the current capacitance values become minimum values in step 18A, the processing proceeds to step 20 at the time. On the other hand, when the current capacitance values become minimum values in step 18A before the voltage value becomes less than or equal to the threshold Th3 in step 18, the processing proceeds to step 19. In step 19, it is determined whether the voltage value detected in the immediately preceding step 14 is less than or equal to the threshold Th3, and the loop operations of steps 12 through 19 are repeated until the voltage value becomes less than or equal to the threshold Th3. Also in this case, the range of the voltage value less than or equal to the threshold Th3 is the predetermined range. The contents of the other operations are the same or similar to those of the case of obtaining the upper-side peak of the output periodic signal $S_O$.

The reason why the amplitude of the output periodic signal $S_O$ is adjusted as depicted in steps 11, 12, 18 and 19 will now be described. If the amplitude of the output periodic signal $S_O$ is too large, the upper-side and lower-side peaks of the waveform of the output periodic signal $S_O$ may be cut off, and the waveform information that indicates the peak values may be lost. In such a case, it may be difficult to obtain the timings of the peak values precisely and carry out adjustment of the amplitude of the output periodic signal $S_O$ described later using FIG. 19 appropriately.

Figure 19:
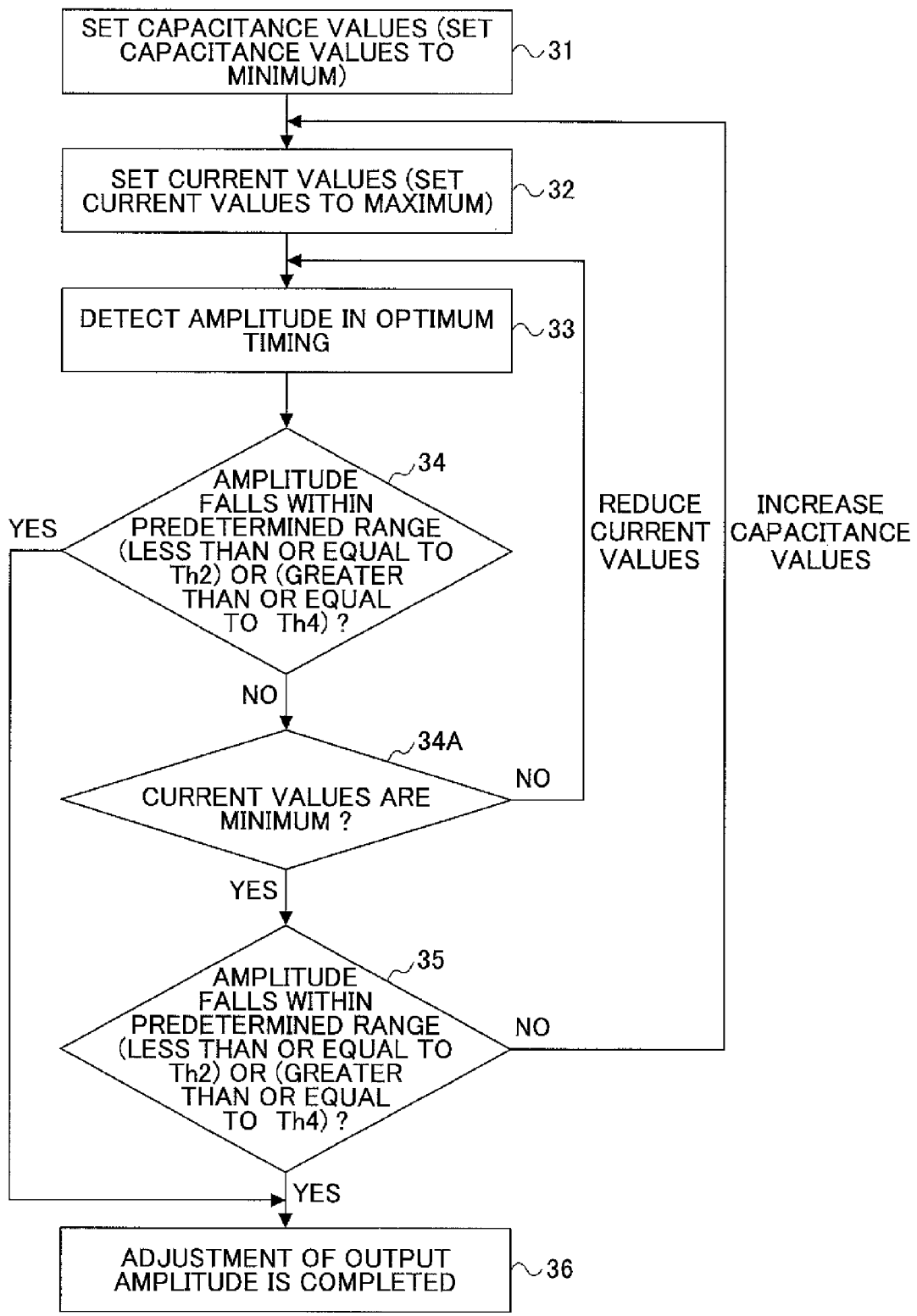
FIG. 19 is a flowchart illustrating a flow of operations of adjusting an output amplitude of the phase interpolator of FIG. 6.

After the operations of FIG. 18, operations of FIG. 19 will be carried out. Also the operations of FIG. 19 are carried out by the state machine ST1. According to a flow of the operations of FIG. 19, it is possible to realize operations of adjusting the amplitude of the output periodic signal $S_O$ to be an optimum one with lower power consumption. This is because operations of reducing the current values of the current sources I11, I12, I21 and I22 are carried out first.

In step 31, the respective capacitance values of the capacitors Cap1 and Cap2 are set to the minimum values. In step 32, the respective current values I of the current sources I11, I12, I21 and I22 are set to the maximum values. In step 33, the optimum value of the delay amount of the delay circuit DL1 obtained by the operations of FIG. 18 is applied, and the voltage value of the output periodic signal $S_O$ is detected by the amplitude detection circuit of FIG. 11. In step 34, it is determined whether the detected voltage value falls within the predetermined range, for example, is less than or equal to the threshold Th2 depicted in FIG. 9. That is, it is determined whether the detected voltage value of the signal $S_O$ falls within the range less than or equal to the threshold Th2. In this case, the range of the voltage value less than or equal to the threshold Th2 is the predetermined range. In a case where the detected voltage value is greater than the threshold Th2 (step 34 no), it is determined in step 34A whether the respective current values I of the current sources I11, I12, I21 and I22 of the PI (PI1) are the minimum values. In a case where the respective current values I of the current sources I11, I12, I21 and I22 of the PI (PI1) are not the minimum values in step 34A, each of the current values I of the current sources I11, I12, I21 and I22 of the PI (PI1) is reduced by a predetermined amount. Then, until the respective current values I of the current sources I11, I12, I21 and I22 become the minimum values in step 34A, the loop operations of steps 33 through 34A are repeated. However, when the detected voltage value of the signal $S_O$ becomes a value within the range less than or equal to the threshold Th2 in step 34 before the respective current values I of the current sources I11, I12, I21 and I22 become the minimum values in step 34A, the processing proceeds to step 36 at the time. In step 36, the operations of FIG. 19 are finished (i.e., adjustment of the output amplitude is completed).

Through the repetitions of the loop operations of steps 33 through 34A, the respective current values I of the current sources I11, I12, I21 and I22 are gradually reduced, the speeds of voltage changes by charging/discharging of the capacitors Cap1 and Cap2 are gradually reduced, and as a result the amplitude of the output periodic signal $S_O$ is gradually reduced. When the voltage value of the output periodic signal $S_O$ detected in step 33 thus becomes less than or equal to the threshold Th2 in step 34 before the respective current values of the current sources I11, I12, I21 and I22 become the minimum values in step 34A, the processing proceeds to step 36 as mentioned above. On the other hand, when the respective current values of the current sources I11, I12, I21 and I22 become the minimum values in step 34A before the voltage value of the output periodic signal $S_O$ becomes less than or equal to the threshold Th2 in step 34, the processing proceeds to step 35.

In step 35, it is determined whether the voltage value detected in step 33 is less than or equal to the above-mentioned threshold Th2. In this case, the range of the voltage value less than or equal to the threshold Th2 is the predetermined range. In a case where the voltage value detected in step 33 is greater than the threshold Th2, each of the capacitance values of the capacitors Cap1 and Cap2 of the PI (PI1) is increased by a predetermined value, and until the voltage value detected in step 33 becomes less than or equal to the threshold Th2, the loop operations of step 32 through 35 are repeated. That is, in a case where the sweeping of the current values (the repetitions of loop operations of steps 33 through 34A) has been completed before the voltage value of the signal $S_O$ falls within the predetermined range (step 34 yes), the sweeping of the capacitance values (the repetitions of loop operations of steps 32 through 35) is carried out. Through the repetitions of loop operations of steps 32 through 35, the respective capacitance values of the capacitors Cap1 and Cap2 are gradually increased, the speeds of voltage changes due to charging/discharging of the capacitors Cap1 and Cap2 are gradually reduced, and as a result the amplitude of the output periodic signal $S_O$ is gradually reduced. When the voltage value detected in step 33 thus becomes less than or equal to the threshold Th2 in step 35, the processing proceeds to step 36.

Thus, the case of obtaining the upper-side peak of the voltage value of the output periodic signal $S_O$ has been described. The same or similar way may be also applied for a case of obtaining the lower-side peak of the voltage value of the output periodic signal $S_O$. However, in this case, in step 34, it is determined whether the voltage value detected in the immediately preceding step 33 is greater or equal to the threshold Th4 of FIG. 9. In step 34A, it is determined whether the respective current values I of the current sources I11, I12, I21 and I22 are the minimum values. In this case, the range of the voltage value greater than or equal to the threshold Th4 is the predetermined range. Then, until the respective current values I of the current sources I11, I12, I21 and I22 become the minimum values, the loop operations of steps 33 through 34A are repeated. However, when the voltage value of the signal $S_O$ becomes greater than or equal to the threshold Th4 in step 34 before the respective current values I of the current sources I11, I12, I21 and I22 become the minimum values in step 34A, the processing proceeds to step 36 at the time. When the respective current values I of the current sources I11, I12, I21 and I22 become the minimum values in step 34A before the voltage value of the signal $S_O$ becomes greater than or equal to the threshold Th4 in step 34, the processing proceeds to step 35.

In step 35, it is determined whether the voltage value detected in the immediately preceding step 33 is greater or equal to the threshold Th4, and the loop operations of steps 32 through 35 are repeated until the voltage value detected in the immediately preceding step 33 becomes greater or equal to the threshold Th4. In this case, the range of the voltage value greater than or equal to the threshold Th4 is the predetermined range. The contents of the other operations are the same or similar to those of the case of obtaining the upper-side peak of the output periodic signal $S_O$.

It is noted that the operations of FIGS. 18 and 19 are carried out once at a time of starting up the system of the computer 100 depicted in FIG. 1. Further, the operations of FIGS. 18 and 19 have been thus described assuming that the operations are carried out on the positive-side signal of differential signals. However, it is also possible to carry out the operations of FIGS. 18 and 19 both on the positive-side signal and the negative-side signal of the differential signals in consideration of process variations in the LSI chip that includes the PI (PI1). In a case of carrying out the operations of FIGS. 18 and 19 on the negative-side signal of the differential signals, a connection is changed as indicated in FIG. 6 by a broken line so that the signal to be input to the delay circuit DL1 is changed from the to-be-synthesized periodic signal $S_A$ to the to-be-synthesized periodic signal $S_{XA}$. Further, a connection is changed as indicated in FIG. 6 by another broken line so that the output periodic signal to be input to the resistance element R1 is changed from the output periodic signal $S_O$ to the output periodic signal $S_{XO}$. Operations to be carried out after the connections are thus changed are the same as or similar to those of the above-mentioned case where operations are carried out on the positive-side signal of the differential signals.

According to the embodiments described above, it is possible to sweep a waveform of a synthesized periodic signal by repeating detection of a value of the synthesized periodic signal at a timing corresponding to a phase of a signal obtained from delaying a periodic signal that is used for the synthesis while the delay amount is being changed. As a result, it is possible to detect a timing at which it can be determined that the value is a maximum or a minimum along the waveform. Then, an adjustment is carried out in such a manner that the value of the synthesized periodic signal which can be determined as a maximum value or a minimum value falls within a predetermined range. Thus, it is possible to avoid a problem that may be caused by a fact that the amplitude of the synthesized periodic signal does not fall within the predetermined range.

All examples and conditional language provided herein are intended for pedagogical purposes of aiding the reader in understanding the invention and the concepts contributed by the inventor to further the art, and are not to be construed as limitation to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A phase interpolator comprising:
   a first signal generation circuit that generates a first output signal that has a phase corresponding to a phase of a first periodic signal that has been input;
   a second signal generation circuit to which a second periodic signal having a phase different from that of the first periodic signal is input, the second signal generation circuit generating a second output signal that has a phase corresponding to a phase of the second periodic signal;
   a third signal generation circuit that generates a third periodic signal by synthesizing the first output signal and the second output signal;
   a delay circuit that provides a variable delay amount to the first periodic signal;
   a detection circuit that detects a value of the third periodic signal at a timing corresponding to the phase of the first periodic signal that is delayed by the delay circuit;
   an optimum delay amount obtaining circuit that compares the value of the third periodic signal detected by the detection circuit according to the first periodic signal that has the delay amount with the value of the third periodic signal detected by the detection circuit according to the first periodic signal that has the different delay amount and obtains as an optimum delay amount the delay amount at which the detected value of the third periodic signal is a maximum or a minimum; and
   an amplitude adjustment circuit that, in a state of the optimum delay amount being set to the delay circuit, adjusts an amplitude of the third periodic signal in such a manner that the value of the third periodic signal detected by the detection circuit falls within a predetermined range.

2. The phase interpolator according to claim 1, wherein the detection circuit includes:
   a chopper circuit that generates a timing signal that is output at a timing corresponding to the phase of the signal that has been delayed by the delay circuit,
   a gate circuit that allows the third periodic signal to pass through at a timing of the timing signal being output,
   a capacitance element that is charged by the third periodic signal that has passed through the gate circuit, and
   a control circuit that obtains a value corresponding to a voltage of the capacitance element after elapse of a predetermined period of time from a start of charging the capacitance element as the value of the third periodic signal which has been detected at a timing corresponding to the delay amount given by the delay circuit.

3. The phase interpolator according to claim 1, wherein the first signal generation circuit includes a first CMOS inverter circuit and a first current source that supplies drain currents to transistors included in the first CMOS inverter circuit, an amplitude of the first output signal being determined by a current value of the first current source, the second signal generation circuit includes a second CMOS inverter circuit and a second current source that supplies drain currents to transistors included in the second CMOS inverter circuit, an amplitude of the second output signal being determined by a current value of the second current source, the third signal generation circuit includes a capacitance element that is connected to a connection point that connects a point of outputting the first output signal by the first signal generation circuit and a point of outputting the second output signal by the second signal generation circuit, and the amplitude adjustment circuit includes a part that changes the respective current values of the first current source and the second current source while maintaining a ratio between the current value of the first current source and the current value of the second current source and a part that changes a capacitance value of the capacitance element.

4. The phase interpolator according to claim 2, wherein the first signal generation circuit includes a first CMOS inverter circuit and a first current source that supplies drain currents to transistors included in the first CMOS inverter circuit, an amplitude of the first output signal being determined by a current value of the first current source, the second signal generation circuit includes a second CMOS inverter circuit and a second current source that supplies drain currents to transistors included in the second CMOS inverter circuit, an amplitude of the second output signal being determined by a current value of the second current source, the third signal generation circuit includes a capacitance element that is connected to a connection point that connects a point of outputting the first output signal by the first signal generation circuit and a point of outputting the second output signal by the second signal generation circuit, and the amplitude adjustment circuit includes a part that changes the respective current values of the first current source and the second current source while maintaining a ratio between the current value of the first current source and the current value of the second current source and a part that changes a capacitance value of the capacitance element.

5. A reception circuit comprising:
a periodic signal generation circuit that generates a first periodic signal and a second periodic signal that has a phase different from that of the first periodic signal;
a first signal generation circuit that generates a first output signal that has a phase corresponding to the phase of the first periodic signal that has been input;
a second signal generation circuit that generates a second output signal that has a phase corresponding to the phase of the second periodic signal that has been input;
a third signal generation circuit that generates a third periodic signal by synthesizing the first output signal and the second output signal;
a delay circuit that delays the first periodic signal;
a detection circuit that detects a value of the third periodic signal at a timing corresponding to the phase of the first periodic signal that is delayed by the delay circuit;
an optimum delay amount obtaining circuit that compares the value of the third periodic signal detected by the detection circuit according to the first periodic signal that has the delay amount with the value of the third periodic signal detected by the detection circuit according to the first periodic signal that has the different delay amount and obtains as an optimum delay amount the delay amount at which it is determined that the detected value of the third periodic signal is a maximum or a minimum;
an amplitude adjustment circuit that adjusts an amplitude of the third periodic signal in such a manner that the value of the third periodic signal detected by the detection circuit at the optimum delay amount falls within a predetermined range;
a data taking circuit that takes reception data from a reception signal at a timing corresponding to a phase of the third periodic signal; and
a phase adjuster that adjusts the phase of the third periodic signal by adjusting an amplitude of the first output signal and an amplitude of the second output signal.

6. The reception circuit according to claim 5, wherein the detection circuit includes
a chopper circuit that generates a timing signal that is output at a timing corresponding to the phase of the signal that has been delayed by the delay circuit,
a gate circuit that allows the third periodic signal to pass through at a timing of the timing signal being output,
a capacitance element that is charged by the third periodic signal that has passed through the gate circuit, and
a control circuit that obtains a value corresponding to a voltage of the capacitance element after elapse of a predetermined period of time from a start of charging the capacitance element as the value of the third periodic signal which has been detected at a timing corresponding to the delay amount given by the delay circuit.

7. The reception circuit according to claim 5, wherein the first signal generation circuit includes a first CMOS inverter circuit and a first current source that supplies drain currents to transistors included in the first CMOS inverter circuit, an amplitude of the first output signal being determined by a current value of the first current source, the second signal generation circuit includes a second CMOS inverter circuit and a second current source that supplies drain currents to transistors included in the second CMOS inverter circuit, an amplitude of the second output signal being determined by a current value of the second current source, the third signal generation circuit includes a capacitance element that is connected to a connection point that connects a point of outputting the first output signal by the first signal generation circuit and a point of outputting the second output signal by the second signal generation circuit, and the amplitude adjustment circuit includes a part that changes the respective current values of the first current source and the second current source while maintaining a ratio between the current value of the first current source and the current value of the second current source and a part that changes a capacitance value of the capacitance element.

8. The reception circuit according to claim 6, wherein the first signal generation circuit includes a first CMOS inverter circuit and a first current source that supplies drain currents to transistors included in the first CMOS inverter circuit, an amplitude of the first output signal being determined by a current value of the first current source, the second signal generation circuit includes a second CMOS inverter circuit and a second current source that supplies drain currents to transistors included in the second CMOS inverter circuit, an amplitude of the second output signal being determined by a current value of the second current source, the third signal generation circuit includes a capacitance element that is connected to a connection point that connects a point of outputting the first output signal by the first signal generation circuit and a point of outputting the second output signal by the second signal generation circuit, and the amplitude adjustment circuit includes a part that changes the respective current values of the first current source and the second current source while maintaining a ratio between the current value of the first current source and the current value of the second current source and a part that changes a capacitance value of the capacitance element.

9. An information processing apparatus comprising:
an arithmetic and logic unit;
a storage unit that stores data to be used by the arithmetic and logic unit for operations and stores data obtained from the operations; and
a control unit that controls operations of the arithmetic and logic unit and the storage unit, wherein
at least one of the arithmetic and logic unit, the storage unit and the control unit includes a reception circuit that receives data from another unit, and
the reception circuit includes
  a periodic signal generation circuit that generates a first periodic signal and a second periodic signal that has a phase different from that of the first periodic signal,
  a first signal generation circuit that generates a first output signal that has a phase corresponding to the phase of the first periodic signal that has been input,
  a second signal generation circuit that generates a second output signal that has a phase corresponding to the phase of the second periodic signal that has been input,
  a third signal generation circuit that generates a third periodic signal by synthesizing the first output signal and the second output signal,
  a delay circuit that delays the first periodic signal,
  a detection circuit that detects a value of the third periodic signal at a timing corresponding to the phase of the first periodic signal that is delayed by the delay circuit,
  an optimum delay amount obtaining circuit that compares the value of the third periodic signal detected by the detection circuit according to the first periodic signal that has the delay amount with the value of the third periodic signal detected by the detection circuit according to the first periodic signal that has the different delay amount and obtains as an optimum delay amount the delay amount at which it is determined that the detected value of the third periodic signal is a maximum or a minimum,
  an amplitude adjustment circuit that adjusts an amplitude of the third periodic signal in such a manner that the value of the third periodic signal detected by the detection circuit at the optimum delay amount falls within a predetermined range,
  a data taking circuit that takes reception data from a reception signal at a timing corresponding to a phase of the third periodic signal, and
  a phase adjuster that adjusts the phase of the third periodic signal by adjusting an amplitude of the first output signal and an amplitude of the second output signal.

10. The information processing apparatus according to claim 9, wherein
the detection circuit includes
  a chopper circuit that generates a timing signal that is output at a timing corresponding to the phase of the signal that has been delayed by the delay circuit,
  a gate circuit that allows the third periodic signal to pass through at a timing of the timing signal being output,
  a capacitance element that is charged by the third periodic signal that has passed through the gate circuit, and
  a control circuit that obtains a value corresponding to a voltage of the capacitance element after elapse of a predetermined period of time from a start of charging the capacitance element as the value of the third periodic signal which has been detected at a timing corresponding to the delay amount given by the delay circuit.

11. The information processing apparatus according to claim 9, wherein
the first signal generation circuit includes a first CMOS inverter circuit and a first current source that supplies drain currents to transistors included in the first CMOS inverter circuit, an amplitude of the first output signal being determined by a current value of the first current source, the second signal generation circuit includes a second CMOS inverter circuit and a second current source that supplies drain currents to transistors included in the second CMOS inverter circuit, an amplitude of the second output signal being determined by a current value of the second current source, the third signal generation circuit includes a capacitance element that is connected to a connection point that connects a point of outputting the first output signal by the first signal generation circuit and a point of outputting the second output signal by the second signal generation circuit, and the amplitude adjustment circuit includes a part that changes the respective current values of the first current source and the second current source while maintaining a ratio between the current value of the first current source and the current value of the second current source and a part that changes a capacitance value of the capacitance element.

12. The information processing apparatus according to claim 10, wherein
the first signal generation circuit includes a first CMOS inverter circuit and a first current source that supplies drain currents to transistors included in the first CMOS inverter circuit, an amplitude of the first output signal being determined by a current value of the first current source, the second signal generation circuit includes a second CMOS inverter circuit and a second current source that supplies drain currents to transistors included in the second CMOS inverter circuit, an amplitude of the second output signal being determined by a current value of the second current source, the third signal generation circuit includes a capacitance element that is connected to a connection point that connects a point of outputting the first output signal by the first signal generation circuit and a point of outputting the second output signal by the second signal generation circuit, and the amplitude adjustment circuit includes a part that changes the respective current values of the first current source and the second current source while maintaining a ratio between the current value of the first current source and the current value of the second current source and a part that changes a capacitance value of the capacitance element.

* * * * *